US012702078B2

(12) United States Patent
Chen et al.

(10) Patent No.: US 12,702,078 B2
(45) Date of Patent: Aug. 4, 2026

(54) REDISTRIBUTION STRUCTURE WITH COPPER BUMPS ON PLANAR METAL INTERCONNECTS AND METHODS OF FORMING THE SAME

(71) Applicant: Taiwan Semiconductor Manufacturing Company Limited, Hsinchu (TW)

(72) Inventors: Hsien-Wei Chen, Hsinchu City (TW); Meng-Liang Lin, Hsinchu (TW); Ying-Ju Chen, Tuku Township (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 955 days.

(21) Appl. No.: 17/826,223

(22) Filed: May 27, 2022

(65) Prior Publication Data

US 2023/0386984 A1 Nov. 30, 2023

(51) Int. Cl.
*H10W 90/00* (2026.01)
*H10W 70/05* (2026.01)
*H10W 70/65* (2026.01)
*H10W 70/66* (2026.01)
(Continued)

(52) U.S. Cl.
CPC ......... *H10W 90/701* (2026.01); *H10W 70/05* (2026.01); *H10W 70/095* (2026.01); *H10W 70/65* (2026.01); *H10W 70/66* (2026.01); *H10W 70/685* (2026.01); *H10W 90/401* (2026.01); *H10W 74/15* (2026.01); *H10W 90/00* (2026.01);
(Continued)

(58) Field of Classification Search
CPC ........... H01L 23/49816; H01L 21/4857; H01L 24/16; H01L 25/0655; H01L 2224/73204; H01L 23/5383; H01L 2224/23; H01L 2224/24; H10W 90/701; H10W 70/05; H10W 70/095; H10W 70/65; H10W 70/66; H10W 70/685; H10W 90/401; H10W 74/15; H10W 90/00; H10W 90/724; H10W 90/734; H10W 72/20; H10W 72/072; H10W 70/611; H10W 42/121; H10P 72/74; H10P 72/7418; H10P 72/7424; H10P 72/743; H10P 72/7434
See application file for complete search history.

(56) References Cited

U.S. PATENT DOCUMENTS

2018/0190531 A1* 7/2018 Shih ..................... H01L 21/6835
2021/0043557 A1* 2/2021 Lee ......................... H01L 24/19

* cited by examiner

*Primary Examiner* — Jessica S Manno
*Assistant Examiner* — Ricky Verdes
(74) *Attorney, Agent, or Firm* — The Marbury Law Group, PLLC

(57) ABSTRACT

First redistribution interconnect structures having a respective uniform thickness throughout are formed on a top surface of a first adhesive layer over a first carrier wafer. Redistribution dielectric layers and additional redistribution interconnect structures are formed over the first redistribution interconnect structures to provide at least one redistribution structure. A respective set of one or more semiconductor dies is attached to each of the at least one redistribution structure. The first redistribution interconnect structures are physically exposed by removing the first carrier wafer and the first adhesive layer. Fan-out bump structures are formed on the physically exposed first planar surfaces of the first redistribution interconnect structures.

20 Claims, 18 Drawing Sheets

(51) Int. Cl.
    *H10W 70/685*      (2026.01)
    *H10W 74/15*       (2026.01)

(52) U.S. Cl.
    CPC ........ *H10W 90/724* (2026.01); *H10W 90/734*
                                (2026.01)

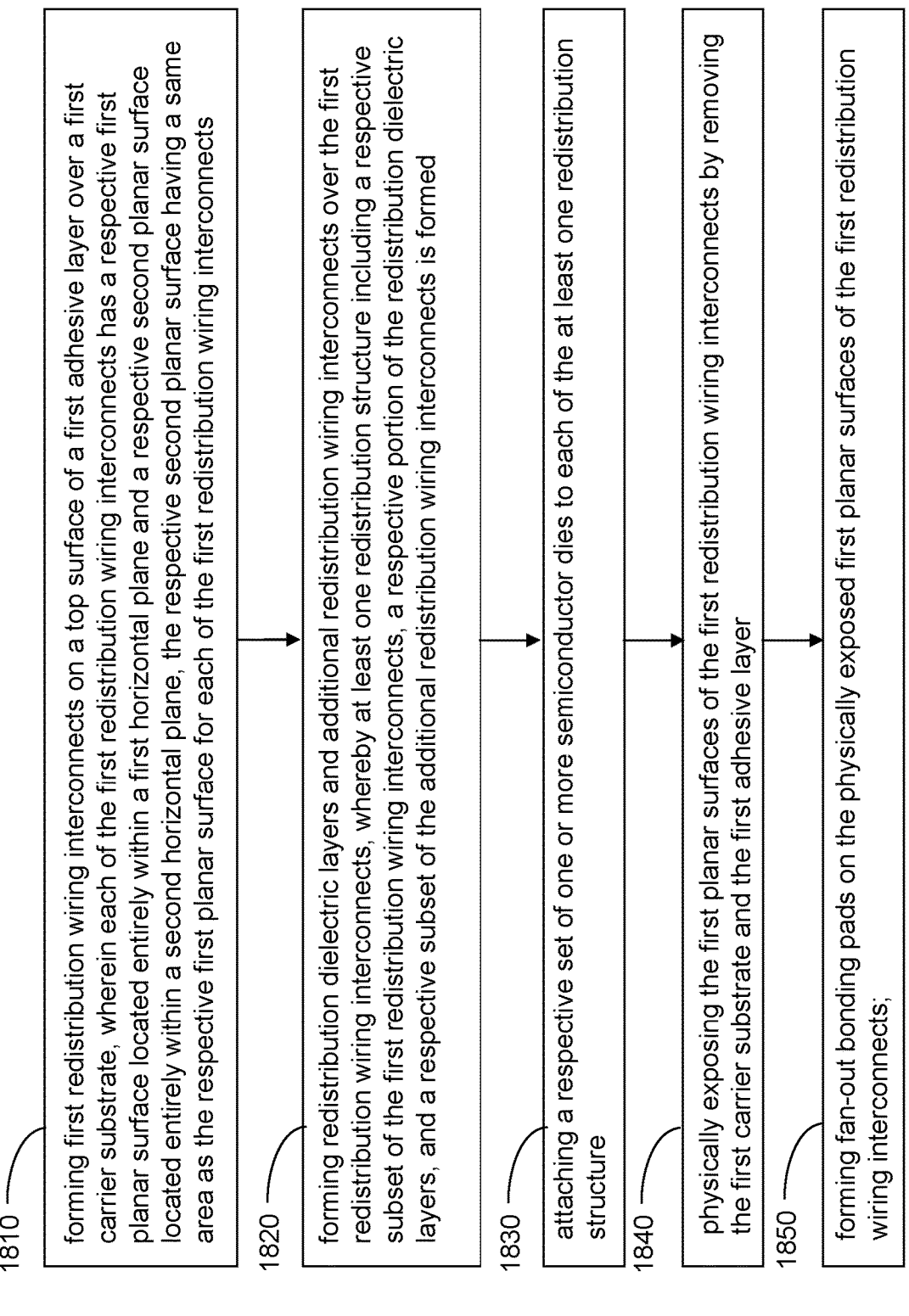

1810 — forming first redistribution wiring interconnects on a top surface of a first adhesive layer over a first carrier substrate, wherein each of the first redistribution wiring interconnects has a respective first planar surface located entirely within a first horizontal plane and a respective second planar surface located entirely within a second horizontal plane, the respective second planar surface having a same area as the respective first planar surface for each of the first redistribution wiring interconnects 1820 — forming redistribution dielectric layers and additional redistribution wiring interconnects over the first redistribution wiring interconnects, whereby at least one redistribution structure including a respective subset of the first redistribution wiring interconnects, a respective portion of the redistribution dielectric layers, and a respective subset of the additional redistribution wiring interconnects is formed 1830 — attaching a respective set of one or more semiconductor dies to each of the at least one redistribution structure 1840 — physically exposing the first planar surfaces of the first redistribution wiring interconnects by removing the first carrier substrate and the first adhesive layer 1850 — forming fan-out bonding pads on the physically exposed first planar surfaces of the first redistribution wiring interconnects;

FIG. 18

REDISTRIBUTION STRUCTURE WITH COPPER BUMPS ON PLANAR METAL INTERCONNECTS AND METHODS OF FORMING THE SAME

BACKGROUND

Embedded via pads are via portions of redistribution metal structures attached to a horizontally-extending line portion of a respective redistribution metal structure. The embedded via pads may be subsequently used as base structures for forming metal bump structures thereupon. Embedded via pads that are used in redistribution structures for the formation of copper bump structures may cause warpage that may result in interconnection failures. In addition, the warpage may cause electrical yield loss through high interfacial resistance or formation of electrical opens.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 18 is a flowchart illustrating steps for forming exemplary structures according to an embodiment of the present disclosure.

DETAILED DESCRIPTION

Figure 1:
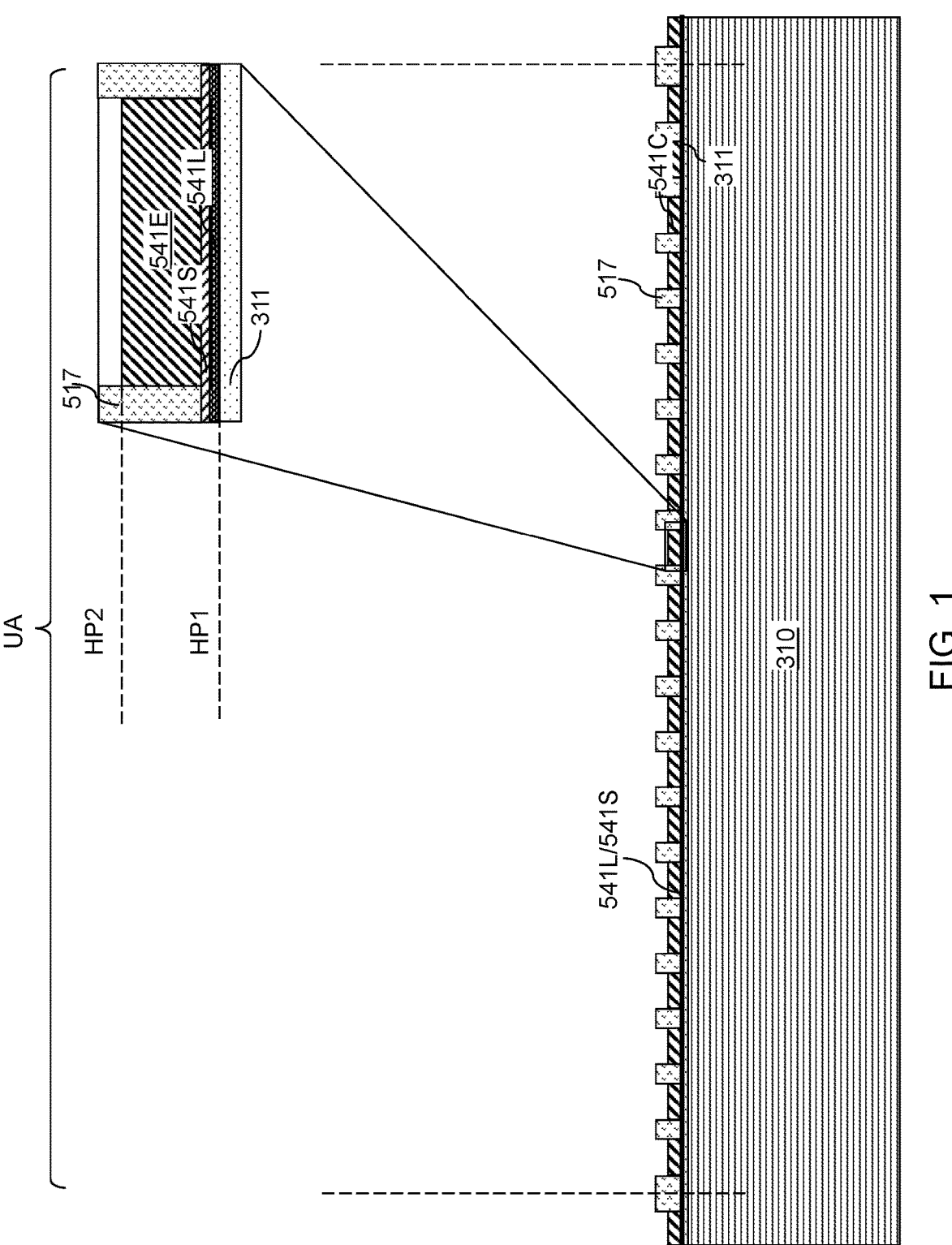
FIG. 1 is a vertical cross-sectional view of a first exemplary structure after formation of a first adhesive layer, a first continuous barrier metal layer, a first continuous copper seed layer, a first patterned electroplating mask layer, and first electroplated copper portions over a first carrier wafer according to a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments disclosed herein may be directed to semiconductor devices, and particularly to an organic interposer configured to reduce mechanical stress on the side of fan-out bump structures that may bond to a packaging substrate, a fan-out semiconductor die including such an organic interposer, and other semiconductor structures incorporating such a fan-out semiconductor die.

A type of organic interposer that includes wide via portions as first metal portions formed on a carrier wafer may suffer from metal cracks and polymer delamination upon the subsequent formation of fan-out bump structures on the first metal portions. Such wide via portions are typically referred to as embedded via pads. The embedded via pads may be subsequently used as a base pad structure to form the fan-out bump structures thereupon. The embedded via pads provides the benefit of improving a stacking profile. However, use of the embedded via pads results in the formation of an extra layer, which increases the potential of stacking warpage. An increase in stacking warpage may adversely impact electrical yield due to the presence of embedded seed layer at redistribution-C4 interfaces, with titanium and/or copper contamination and intermetallic components.

According to an aspect of the present disclosure, an organic interposer is provided that includes redistribution structures that are configured to reduce warpage and enhance the electrical characteristics of semiconductor structures that implement the embodiment organic interposers. The various embodiment organic interposer of the present disclosure may be manufactured with a redistribution layers-first (RDL first) manufacturing process without use of embedded via pads. The various embodiment organic interposer of the present disclosure reduces stacking warpage that may result from the use of multiple levels of redistribution dielectric layers and redistribution interconnect structures. Further, some embodiments of the organic interposer of the present disclosure may increase the electrical yield due to the reduction of seed layer interfaces and intermetallic components. Various aspects of embodiments of the present disclosure are now described with reference to accompanying figures.

Referring to FIG. 1, a first exemplary structure according to a first embodiment of the present disclosure is illustrated. The exemplary structure includes a first carrier wafer 310. The first carrier wafer 310 may include an optically transparent substrate such as a glass substrate or a sapphire substrate, or may comprise a semiconductor substrate such as a silicon substrate. The diameter of the first carrier wafer 310 may be in a range from 150 mm to 450 mm, although lesser and greater diameters may be used. The thickness of the first carrier wafer 310 may be in a range from 500 microns to 2,000 microns, although lesser and greater thicknesses may also be used. Alternatively, the first carrier wafer 310 may be provided in a rectangular panel format. A first adhesive layer 311 may be applied to a front-side surface of the first carrier wafer 310. In one embodiment, the first adhesive layer 311 may be a light-to-heat conversion (LTHC) layer. Alternatively, the first adhesive layer 311 may include a thermally decomposing adhesive material.

At least one redistribution structure may be subsequently formed over the first adhesive layer 311. In one embodiment, a two-dimensional array of redistribution structures may be formed over the first adhesive layer 311. Each redistribution structure may be subsequently diced to provide an organic interposer. In one embodiment, the two-dimensional array of redistribution structures may be formed as a two-dimensional periodic array of redistribution structures having a first periodicity along a first horizontal direction and having a second periodicity along a second horizontal direction which may be perpendicular to the first horizontal direction. In this embodiment, each of the redistribution structures may be formed within a respective unit area UA, which is an area of a repetition unit. In other words, the unit area UA is the area of a unit organic interposer to be subsequently formed.

A first continuous barrier metal layer 541L and a first continuous copper seed layer 541S may be sequentially formed over the first adhesive layer 311. The first continuous barrier metal layer 541L comprises a barrier metallic material such as Ti, Ta, TiN, TaN, WN, or a combination thereof. Other suitable barrier metallic materials are within the contemplated scope of disclosure. The barrier metallic material functions as a diffusion-blocking barrier for copper to be subsequently deposited. The first continuous barrier metal layer 541L may be deposited by a conformal or a nonconformal deposition process. For example, the first continuous barrier metal layer 541L may be deposited by physical vapor deposition or chemical vapor deposition. The thickness of the first continuous barrier metal layer 541L may be in a range from 3 nm to 300 nm such as from 10 nm to 100 nm and/or from 20 nm to 50 nm, although lesser and greater thicknesses may also be used. According to an aspect of the present disclosure, the entirety of the first continuous barrier metal layer 541L may have a uniform thickness throughout, and may have a planar bottom surface located within a first horizontal plane HP1, which is a two-dimensional Euclidean plane. As used herein, a two-dimensional Euclidean plane refers to a flat plane without any curvature therein. The interface between the first adhesive layer 311 and the first continuous barrier metal layer 541L may be located entirely within the first horizontal plane HP1.

The first continuous copper seed layer 541S comprises, and/or consists essentially of, copper. The first continuous copper seed layer 541S may be deposited, for example, by physical vapor deposition. The entirety of the first continuous copper seed layer 541S may have a same thickness throughout. The thickness of the first continuous copper seed layer 541S may be in a range from 100 nm to 1,000 nm, such as from 200 nm to 500 nm, although lesser and greater thicknesses may also be used.

A first patterned electroplating mask layer 517 may be formed over the first continuous copper seed layer 541S. In one embodiment, the first patterned electroplating mask layer 517 may comprise a patterned photoresist layer. For example, the first patterned electroplating mask layer 517 may be formed by applying and lithographically patterning a photoresist layer such that openings having straight vertical sidewalls are formed through the photoresist layer. A top surface segment of the first continuous copper seed layer 541S may be physically exposed at the bottom of each opening through the first patterned electroplating mask layer 517.

An electroplating process may be performed to electroplate copper on physically exposed surfaces of the first continuous copper seed layer 541S within openings through the first patterned electroplating mask layer 517. Generally, any copper electroplating process known in the art may be used to electroplate copper. Electroplated portions of copper formed within the openings in the first patterned electroplating mask layer 517 are herein referred to as first electroplated copper portions 541E. The entirety of the physically exposed surfaces of the first continuous copper seed layer 541S may be located within a horizontal plane. Thus, all top surfaces of the first electroplated copper portions 541E may be formed within a second horizontal plane HP2 that is parallel to the first horizontal plane HP1. The second horizontal plane HP2 may be another two-dimensional Euclidean plane. The vertical distance between the first horizontal plane HP1 and the second horizontal plane HP2 may be in a range from 1 micron to 40 microns, such as from 2 microns to 20 microns, and/or from 4 microns to 10 microns, although lesser and greater thicknesses may also be used.

Figure 2:
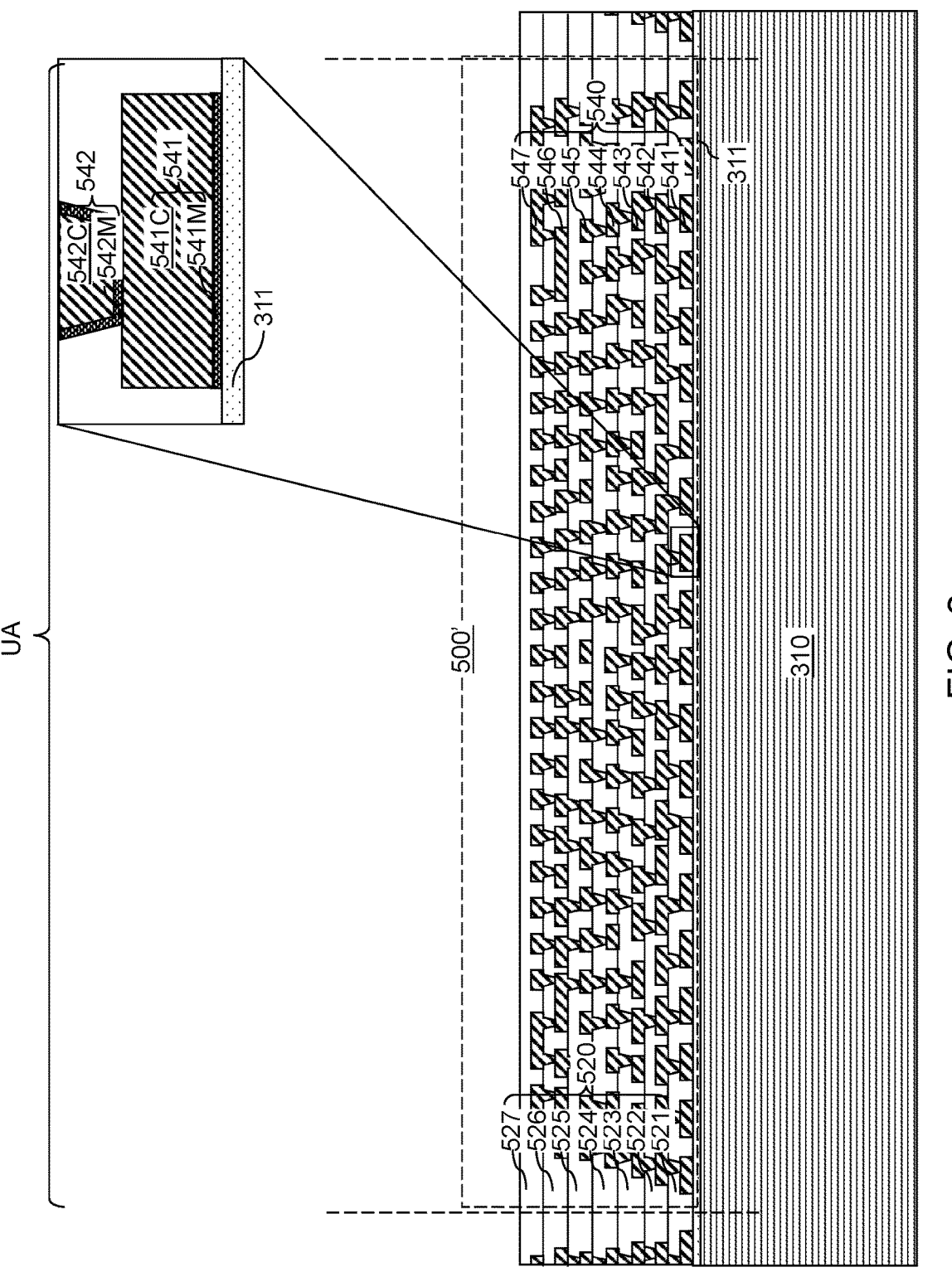
FIG. 2 is a vertical cross-sectional view of the first exemplary structure after formation of redistribution dielectric layers and redistribution interconnect structures over the first carrier layer according to the first embodiment of the present disclosure.

Referring to FIG. 2, the first patterned electroplating mask layer 517 may be removed, for example, by ashing. At least one etch back process may be performed to remove portions of the first continuous copper seed layer 541S and the first continuous barrier metal layer 541L that are not covered by electroplated portions of copper, i.e., by the first electroplated copper portions 541E. The at least one etch back process may comprise at least one anisotropic etch process and/or at least one isotropic etch process. Portions of the top surface of the first adhesive layer 311 that do not underlie the first electroplated copper portions 541E may be physically exposed. Remaining portions of the first continuous barrier metal layer 541L are herein referred to as first barrier metal layers 541M. A thermal anneal process may be performed to induce grain growth in the remaining portions of the first continuous copper seed layer 541S and the first electroplated copper portions 541E. Copper grains may grow within each contiguous combination of remaining portions of the first continuous copper seed layer 541S and the first electroplated copper portions 541E. Each contiguous combination of a remaining portion of the first continuous copper seed layer 541S and a first electroplated copper portion 541E is subsequently used as a copper portion of a respective first redistribution interconnect structure 541, and is herein referred to as a first redistribution wiring copper portion 541C.

Each of the first redistribution interconnect structures 541 may comprise a combination of a first barrier metal layer 541M and a first redistribution wiring copper portion 541C. Each of the first redistribution interconnect structures 541 may be formed on a top surface of the first adhesive layer 311 over the first carrier wafer 310. Each of the first redistribution interconnect structures 541 may have a respective first planar surface located entirely within the first horizontal plane HP1 and a respective second planar surface located entirely within the second horizontal plane HP2. Each sidewall of the first redistribution interconnect structures 541 may be vertical. In one embodiment, the respective second planar surface may have the same area as the respective first planar surface for each of the first redistribution interconnect structures 541. The height of the first redistribution interconnect structures 541 may be the same, and may be in a range from 1 micron to 40 microns, such as from 2 microns to 20 microns, and/or from 4 microns to 10 microns, although lesser and greater thicknesses may also be used.

A first redistribution dielectric layer 521 may be formed directly on the physically exposed portions of the first adhesive layer 311 and over the first redistribution interconnect structures 541. Generally, the thickness of the first redistribution dielectric layer 521 may be in a range from 70% to 200%, such as from 100% to 150%, of the thickness of the first redistribution interconnect structures 541. In one embodiment, the first redistribution dielectric layer 521 may include a dielectric polymer material such as polyimide (PI), benzocyclobutene (BCB), or polybenzobisoxazole (PBO). Other suitable dielectric polymer materials are within the contemplated scope of disclosure. The first redistribution dielectric layer 521 may be formed by spin coating and drying of the respective dielectric polymer material. The thickness of the first redistribution dielectric layer 521 may be in a range from 2 microns to 40 microns, such as from 4 microns to 20 microns, although lesser and greater thicknesses may also be used.

Subsequently, a photoresist layer (not shown) may be applied over the first redistribution dielectric layer 521, and may be subsequently patterned to form openings therein over areas overlying the first redistribution interconnect structures 541. An anisotropic etch process may be performed to transfer the pattern of the openings in the photoresist layer through the first redistribution dielectric layer 521. Via openings are formed through the first redistribution dielectric layer 521 over a respective one of the first redistribution interconnect structures 541. The photoresist layer may be subsequently removed, for example, by ashing.

A second continuous barrier metal layer (not expressly shown) and a second continuous copper seed layer (not expressly shown) may be sequentially formed over the first redistribution dielectric layer 521 and in the via openings directly on physically exposed surfaces of the first redistribution interconnect structures 541. A second patterned electroplating mask layer (not shown) may be formed over the second continuous copper seed layer, and an electroplating process may be performed to electroplate copper on physically exposed surfaces of the second continuous copper seed layer within openings through the second patterned electroplating mask layer. Second electroplated copper portions including a respective laterally-extending copper line segment and at least one respective vertically-extending copper via segment located within a respective via opening through the first redistribution dielectric layer 521 may be formed. Subsequently, the second patterned electroplating mask layer may be removed, for example, by ashing. At least one etch back process may be performed to remove portions of the second continuous copper seed layer and the second continuous barrier metal layer that are not covered by electroplated portions of copper, i.e., by the second electroplated copper portions. Remaining portions of the second continuous barrier metal layer constitute second barrier metal layers 542M. A thermal anneal process may be performed to induce grain growth in the remaining portions of the second continuous copper seed layer and the second electroplated copper portions. Copper grains may grow within each contiguous combination of remaining portions of the second continuous copper seed layer and the second electroplated copper portions. Each contiguous combination of a remaining portion of the second continuous copper seed layer and a second electroplated copper portion constitutes a second redistribution wiring copper portion 542C. Each contiguous combination of a second barrier metal layer 542M and a second redistribution wiring copper portion 542C constitutes a second redistribution interconnect structure 542. Each laterally-extending copper line segment of the second redistribution interconnect structures 542 may have about the same thickness range as the thickness range for the first redistribution interconnect structures 541.

A second redistribution dielectric layer 522 may be formed directly on the physically exposed portions of the first redistribution dielectric layer 521 and over the second redistribution interconnect structures 542. Generally, the second redistribution dielectric layer 522 may have about the same thickness range as the first redistribution dielectric layer 521, and may comprise any material that may be used for the first redistribution dielectric layer 521.

The set of processing steps beginning with the processing step for formation of the openings through the first redistribution dielectric layer 521 and ending with the processing step for formation of the second redistribution dielectric layer 522 may be repeated mutatis mutandis as many times as needed to form additional redistribution dielectric layers (523, 524, 525, 526, 527) and additional redistribution interconnect structures (543, 544, 545, 546, 547). Changes in the processing steps may include changes in the patterns in the openings through an underlying redistribution dielectric layer and changes in the patterns of openings through a patterned electroplating mask layer. In an illustrative example, the additional redistribution dielectric layers (523, 524, 525, 526, 527) may include a third redistribution dielectric layer 523, a fourth redistribution dielectric layer 524, a fifth redistribution dielectric layer 525, a sixth redistribution dielectric layer 526, and a seventh redistribution dielectric layer 527; and the additional redistribution interconnect structures (543, 544, 545, 546, 547) may include third redistribution interconnect structures 543, fourth redistribution interconnect structures 544, fifth redistribution interconnect structures 545, sixth redistribution interconnect structures 546, and seventh redistribution interconnect structures 547. While the present disclosure is described using an embodiment in which seven redistribution dielectric layers and seven redistribution interconnect structures are used, embodiments of the present disclosure may be practiced with two or more redistribution dielectric layers and two or more levels of redistribution interconnect structures. In other words, the number of wiring levels may be any integer greater than 1.

Generally, redistribution dielectric layers 520 (e.g., 521, 523, 524, 525, 526, 527) and additional redistribution interconnect structures (542, 543, 544, 545, 546, 547) may be formed over the first redistribution interconnect structures 541. The redistribution dielectric layers 520 embed the redistribution interconnect structures 540 therein, and thus, are also referred to as wiring-level redistribution dielectric layers 520. At least one redistribution structure 500' including a respective subset of the first redistribution interconnect structures 541, a respective portion of the redistribution dielectric layers 520, and a respective subset of the additional redistribution interconnect structures (542, 543, 544, 545, 546, 547) is formed. A two-dimensional array of redistribution structures 500' may be formed.

Generally, each redistribution structure 500' may comprise redistribution interconnect structures 540 (e.g., 541, 542, 543, 544, 545, 546, 547) laterally surrounded by wiring-level redistribution dielectric layers 520 having a substrate-side planar surface (such as a bottom surface of the first redistribution dielectric layer 521) located within the first horizontal plane HP1, and a die-side planar surface (such as a top surface of the seventh redistribution dielectric layer 527). The redistribution interconnect structures 540 comprise redistribution wire portions (which are horizontally-extending portions) and optionally tapered via portions (which are vertically-extending portions). In one embodiment, a predominant fraction (i.e., more than 50%), and/or each, of the redistribution interconnect structures 540 comprises a respective redistribution wire portion and at least one respective tapered via portion. In one embodiment, each of the first redistribution interconnect structures 541 may consist of a respective redistribution wire portion, and a predominant fraction (i.e., more than 50%), and/or each, of the additional redistribution interconnect structures (542, 543, 544, 545, 546, 547) (i.e., redistribution interconnect structures other than the first redistribution interconnect structures 541) may comprise a respective redistribution wire portion and at least one respective tapered via portion. Each tapered via portion of the redistribution interconnect structures 540 may have has a respective lateral dimension (such as a width) that increases with a distance from a two-dimensional Euclidean plane including the substrate-side planar surface (such as the two-dimensional Euclidean plane including the first horizontal plane HP1). The first redistribution interconnect structures 541 may be free of any via portion, and may have the same thickness throughout. In other words, each of the first redistribution interconnect structures 541 consists of a respective laterally-extending conductive material portion having a uniform thickness throughout.

Figure 3:
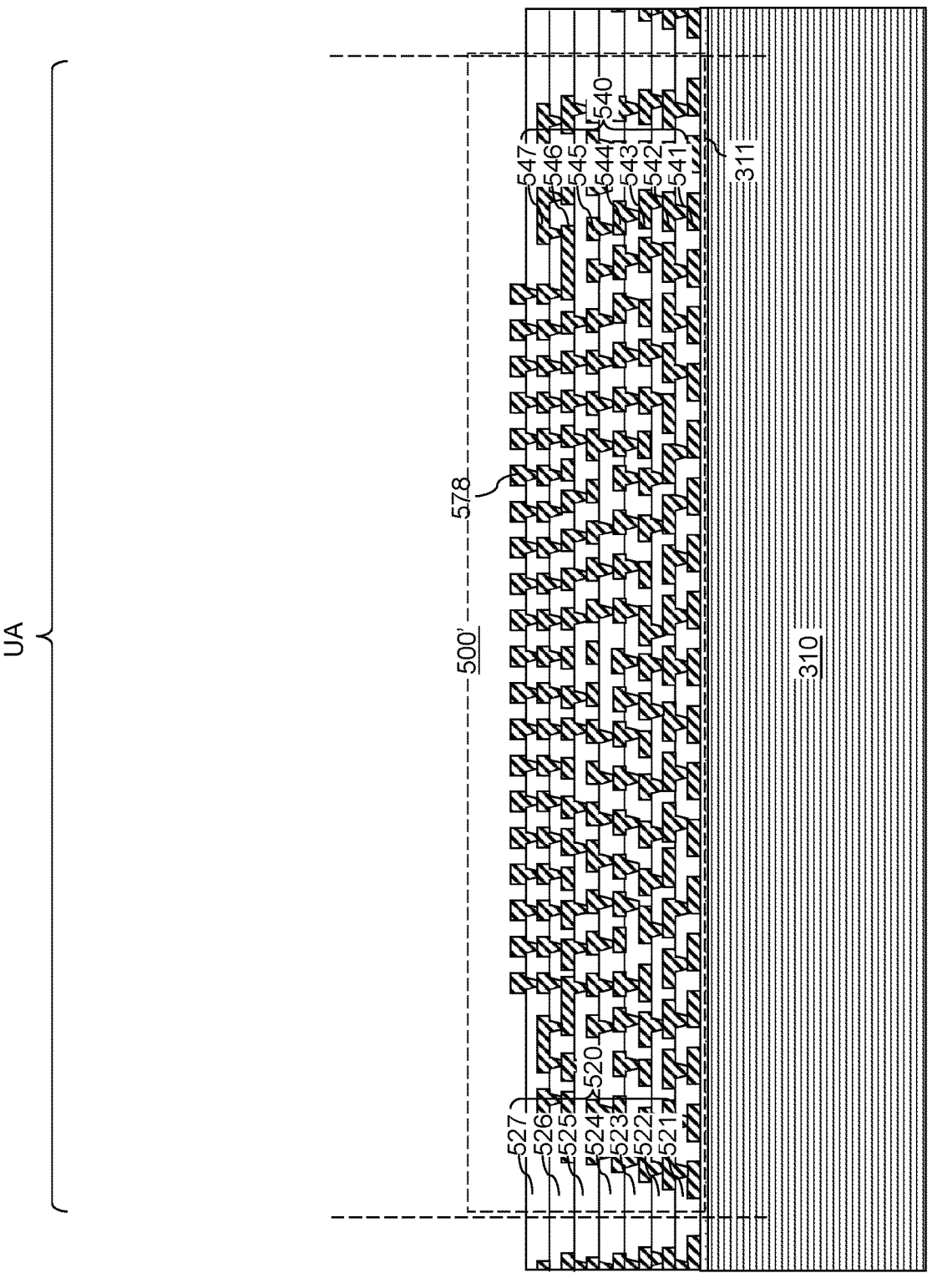
FIG. 3 is a vertical cross-sectional view of the first exemplary structure after formation of on-interposer bump structures according to the first embodiment of the present disclosure.

Referring to FIG. 3, a photoresist layer (not shown) may be formed over the top surface of the topmost redistribution dielectric layer (such as the seventh redistribution dielectric layer 527). The photoresist layer may be lithographically patterned to form openings over areas of underlying topmost redistribution interconnect structures such as the seventh redistribution interconnect structures 547. An anisotropic etch process may be performed to form via openings through the topmost redistribution dielectric layer, and to physically expose top surface segments of the topmost redistribution interconnect structures such as the seventh redistribution interconnect structures 547.

A bump-level barrier metal layer (not expressly shown) and a bump-level copper seed layer (not expressly shown) may be sequentially formed over the topmost redistribution dielectric layer and in the via openings directly on physically exposed surfaces of the topmost redistribution interconnect structures. A bump-level patterned electroplating mask layer (not shown) may be formed over the bump-level copper seed layer, and an electroplating process may be performed to electroplate copper on physically exposed surfaces of the bump-level copper seed layer within openings through the bump patterned electroplating mask layer. The openings in the bump-level patterned electroplating mask layer may be arranged as at least one periodic two-dimensional array of openings having the same periodicity as a periodic two-dimensional array of bump structures located on a respective semiconductor die to be subsequently attached.

Bump-level electroplated copper portions including a respective laterally-extending copper line segment and at least one respective vertically-extending copper via segment located within a respective via opening through the topmost redistribution dielectric layer may be formed. Subsequently, the bump-level patterned electroplating mask layer may be removed, for example, by ashing. At least one etch back process may be performed to remove portions of the bump-level copper seed layer and the bump-level barrier metal layer that are not covered by electroplated portions of copper, i.e., by the bump-level electroplated copper portions. Remaining portions of the bump-level barrier metal layer constitute on-interposer bump barrier metal layers (not expressly shown). A thermal anneal process may be performed to induce grain growth in the remaining portions of the bump-level copper seed layer and the bump-level electroplated copper portions. Copper grains may grow within each contiguous combination of remaining portions of the bump-level copper seed layer and the bump-level electroplated copper portions. Each contiguous combination of a remaining portion of the bump-level copper seed layer and a bump-level electroplated copper portion constitutes a die-side copper bump portion. Each contiguous combination of an on-interposer bump barrier metal layer and a die-side copper bump portion constitutes an on-interposer bump structure 578.

In one embodiment, the on-interposer bump structures 578 may be microbump structures configured for microbump bonding (i.e., C2 bonding). In one embodiment, each of the on-interposer bump structures 578 may comprise a respective cylindrical portion protruding above the horizontal plane including the top surface of the topmost redistribution dielectric layer (such as the seventh redistribution dielectric layer 527). In one embodiment, the cylindrical portions of the on-interposer bump structures 578 may have a height in a range from 5 microns to 100 microns, such as from 10 microns to 40 microns, although lesser or greater heights may also be used. In one embodiment, the on-interposer bump structures 578 may comprise at least one periodic array of microbump structures including copper pillars. Generally, each of the copper pillars may have a respective lateral dimension in a range from 10 microns to 25 microns, although lesser and greater lateral dimensions may also be used.

Figure 4:
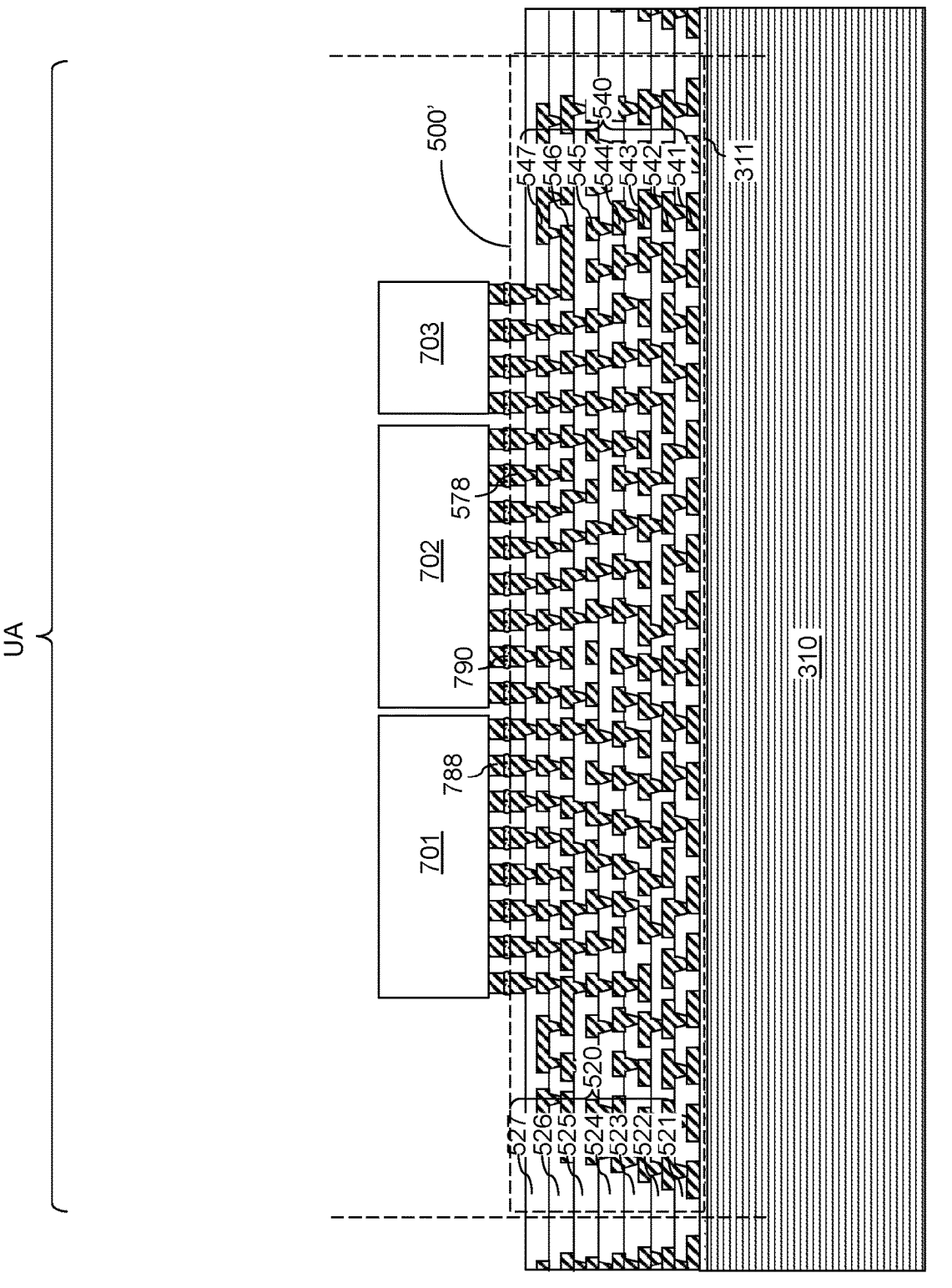
FIG. 4 is a vertical cross-sectional view of the first exemplary structure after attaching a set of one or more semiconductor dies to each redistribution structure according to the first embodiment of the present disclosure.

Referring to FIG. 4, a set of the one or more semiconductor dies (701, 702, 703) may be attached to each subset of the on-interposer bump structures 578 located within the unit area UA. In one embodiment, a two-dimensional array of redistribution structures 500' may be provided over the first carrier wafer 310, and a two-dimensional array of semiconductor die sets, i.e., sets of one or more semiconductor dies (701, 702, 703) may be attached to the two-dimensional array of redistribution structures 500'.

A set of one or more semiconductor dies (701, 702, 703) may be bonded to each redistribution structure 500'. In one embodiment, the redistribution structures 500' may be arranged as a two-dimensional periodic array over the first carrier wafer 310, and multiple sets of one or more semiconductor dies (701, 702, 703) may be bonded to the redistribution structures 500' as a two-dimensional periodic rectangular array of sets of the one or more semiconductor dies (701, 702, 703). Each set of one or more semiconductor dies (701, 702, 703) includes at least one semiconductor die. Each set of one or more semiconductor dies (701, 702, 703) may include any set of at least one semiconductor die known in the art. In one embodiment, each set of one or more semiconductor dies (701, 702, 703) may comprise a plurality of semiconductor dies (701, 702, 703). For example, each set of one or more semiconductor dies (701, 702, 703) may include at least one system-on-chip (SoC) die (701, 702) and/or at least one memory die 703. Optionally, each set of one or more semiconductor dies (701, 702, 703) may include at least one surface mount die (not shown) known in the art. Each SoC die (701, 702) may comprise an application processor die, a central processing unit die, or a graphic processing unit die. In one embodiment, the at least one memory die 703 may comprise a high bandwidth memory (HBM) die that includes a vertical stack of static random access memory dies. In one embodiment, the one or more semiconductor dies (701, 702, 703) may include at least one system-on-chip (SoC) die (701, 702) and at least one high bandwidth memory (HBM) die. Each HBM die may comprise a vertical stack of static random access memory (SRAM) dies that are interconnected to one another through arrays of microbumps and are laterally surrounded by a respective molding material enclosure frame.

Each semiconductor die (701, 702, 703) may comprise a respective array of on-die bump structures 788. Solder material portions may be applied to the on-die bump structures 788 of the semiconductor dies (701, 702, 703), or may be applied to the on-interposer bump structures 578. The solder material portions are herein referred to as die-interposer-bonding (DIB) solder material portions 790, or as first solder material portions. Each of the semiconductor dies (701, 702, 703) may be positioned in a face-down position such that on-die bump structures 788 face the on-interposer bump structures 578. Placement of the semiconductor dies (701, 702, 703) may be performed using a pick and place apparatus such that each of the on-die bump structures 788 may face a respective one of the on-interposer bump structures 578. Each set of one or more semiconductor dies (701, 702, 703) may be placed within a respective unit area UA. A DIB solder material portion 790 is attached to one of the on-die bump structure 788 and the on-interposer bump structure 578 for each facing pair of an on-die bump structure 788 and an on-interposer bump structure 578.

Generally, a redistribution structure 500' may be provided, which includes interposer bump structure 578 thereupon. One or more semiconductor dies (701, 702, 703) may be provided, each of which includes a respective set of on-die bump structures 788. The one or more semiconductor dies (701, 702, 703) may be bonded to the redistribution structure 500' using the DIB solder material portions 790 that are bonded to a respective on-interposer bump structure 578 and to a respective on-die bump structure 788. Each set of one or more semiconductor dies (701, 702, 703) may be attached to a respective redistribution structure 500' through a respective set of DIB solder material portions 790.

In one embodiment, the on-die bump structures 788 and the on-interposer bump structures 578 may be configured for microbump bonding (i.e., C2 bonding). In this embodiment, each of the on-die bump structures 788 and the on-interposer bump structures 578 comprise copper pillar structures having a diameter in a range from 10 microns to 30 microns, and having a respective height in a range from 5 microns to 100 microns. The pitch of the microbumps in the direction of periodicity may be in a range from 20 microns to 60 microns, although lesser and greater pitches may also be used. Upon reflow, the lateral dimensions of each DIB solder material portion 790 may be in a range from 100% to 150% of the lateral dimension (such as a diameter) of the adjoined on-die bump structure 788 or of the adjoined on-interposer bump structure 578.

Figure 5:
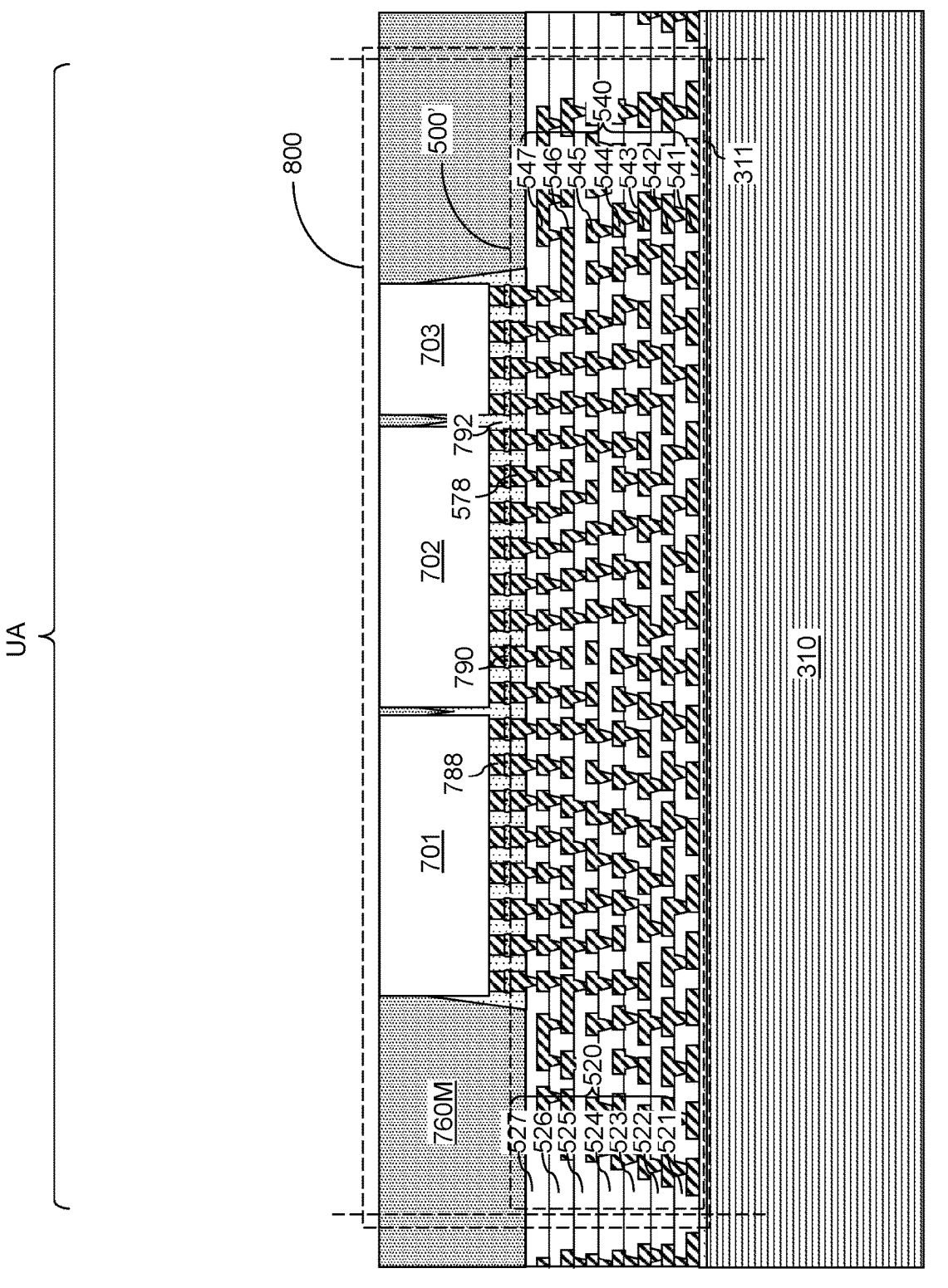
FIG. 5 is a vertical cross-sectional view of the first exemplary structure after formation of underfill material portions and a molding compound matrix according to the first embodiment of the present disclosure.

Referring to FIG. 5, a die-side underfill material may be applied into each gap between the redistribution structures 500' and sets of one or more semiconductor dies (701, 702, 703) that are bonded to the redistribution structures 500'. The die-side underfill material may comprise any underfill material known in the art. A die-side underfill material portion 792 may be formed within each unit area UA between a redistribution structure 500' and an overlying set of one or more semiconductor dies (701, 702, 703). The die-side underfill material portions 792 may be formed by injecting the die-side underfill material around a respective array of DIB solder material portions 790 in a respective unit area. Any known underfill material application method may be used, which may be, for example, the capillary underfill method, the molded underfill method, or the printed underfill method.

Within each unit area, a die-side underfill material portion 792 may laterally surround, and contact, a respective set of the DIB solder material portions 790 within the unit area. The die-side underfill material portion 792 may be formed around, and contact, the DIB solder material portions 790, the on-interposer bump structures 578, and the on-die bump structures 788 in the unit area. Generally, one or more semiconductor dies (701, 702, 703) comprising a respective set of on-die bump structures 788 is attached to the on-interposer bump structures 578 through a respective set of DIB solder material portions 790 within each unit area. Within each unit area, a die-side underfill material portion 792 laterally surrounds the on-interposer bump structures 578 and the on-die bump structures 788 of the one or more semiconductor dies (701, 702, 703).

A molding compound (MC) may be applied to the gaps between assemblies of a respective set of semiconductor dies (701, 702, 703) and a respective die-side underfill material portion 792. The MC includes an epoxy-containing compound that may be hardened (i.e., cured) to provide a dielectric material portion having sufficient stiffness and mechanical strength. The MC may include epoxy resin, hardener, silica (as a filler material), and other additives. The MC may be provided in a liquid form or in a solid form depending on the viscosity and flowability. Liquid MC typically provides better handling, good flowability, less voids, better fill, and less flow marks. Solid MC typically provides less cure shrinkage, better stand-off, and less die drift. A high filler content (such as 85% in weight) within an MC may shorten the time in mold, lower the mold shrinkage, and reduce the mold warpage. Uniform filler size distribution in the MC may reduce flow marks, and may enhance flowability.

The MC may be cured at a curing temperature to form an MC matrix, which is herein referred to as a molding compound (MC) matrix 760M. The MC matrix 760M laterally surrounds and embeds each assembly of a set of semiconductor dies (701, 702, 703) and a die-side underfill material portion 792. The MC matrix 760M includes a plurality of molding compound (MC) die frames that may be laterally adjoined to one another. Each MC die frame is a portion of the MC matrix 760M that is located within a respective unit area UA. Thus, each MC die frame laterally surrounds, and embeds, a respective a set of semiconductor dies (701, 702, 703) and a respective die-side underfill material portion 792. Young's modulus of pure epoxy is about 3.35 GPa, and Young's modulus of the MC may be higher than Young's modulus of pure epoxy due to additives therein. Thus, Young's modulus of the MC matrix 760M may be greater than 3.5 GPa.

Portions of the MC matrix 760M that overlies the horizontal plane including the top surfaces of the semiconductor dies (701, 702, 703) may be removed by a planarization process. For example, the portions of the MC matrix 760M that overlies the horizontal plane may be removed using a chemical mechanical planarization (CMP). A reconstituted wafer is formed over the first carrier wafer 310 and the first adhesive layer 311. The reconstituted wafer may include a two-dimensional array of redistribution structures 500', a two-dimensional array of sets of one or more semiconductor dies (701, 702, 703), a two-dimensional array of die-side underfill material portions 792, and the MC matrix 760M. Each portion of the reconstituted wafer located within a unit area UA constitutes a fan-out package 800. Each fan-out package 800 may comprise one or more semiconductor dies (701, 702, 703), a redistribution structure 500', DIB solder material portions 790, at least one die-side underfill material portion 792, and an MC die frame that is a portion of the MC matrix 760M located within a respective unit area.

Figure 6:
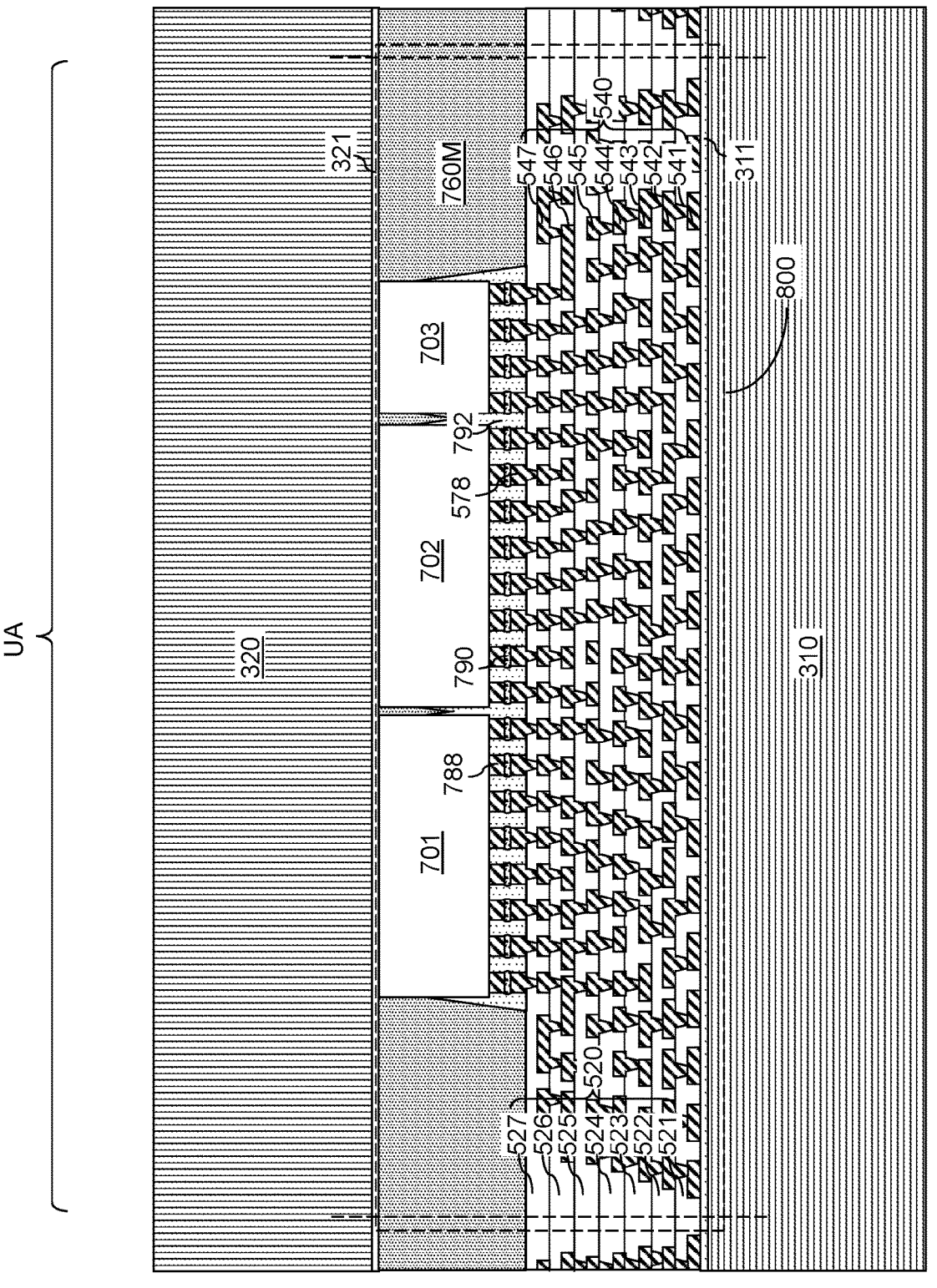
FIG. 6 is a vertical cross-sectional view of the first exemplary structure after attaching a second adhesive layer and a second carrier wafer according to the first embodiment of the present disclosure.

Referring to FIG. 6, a second adhesive layer 321 may be applied on the MC matrix 760M. The second adhesive layer 321 may comprise a light-to-heat conversion (LTHC) layer or a thermally decomposing adhesive material layer depending on the removal mechanism to be subsequently used. A second carrier wafer 320 may be attached to the MC matrix 760M through the second adhesive layer 321. The second carrier wafer 320 may comprise any material that may be used for the first carrier wafer 310, and generally may have about the same thickness range as the first carrier wafer 310.

Figure 7:
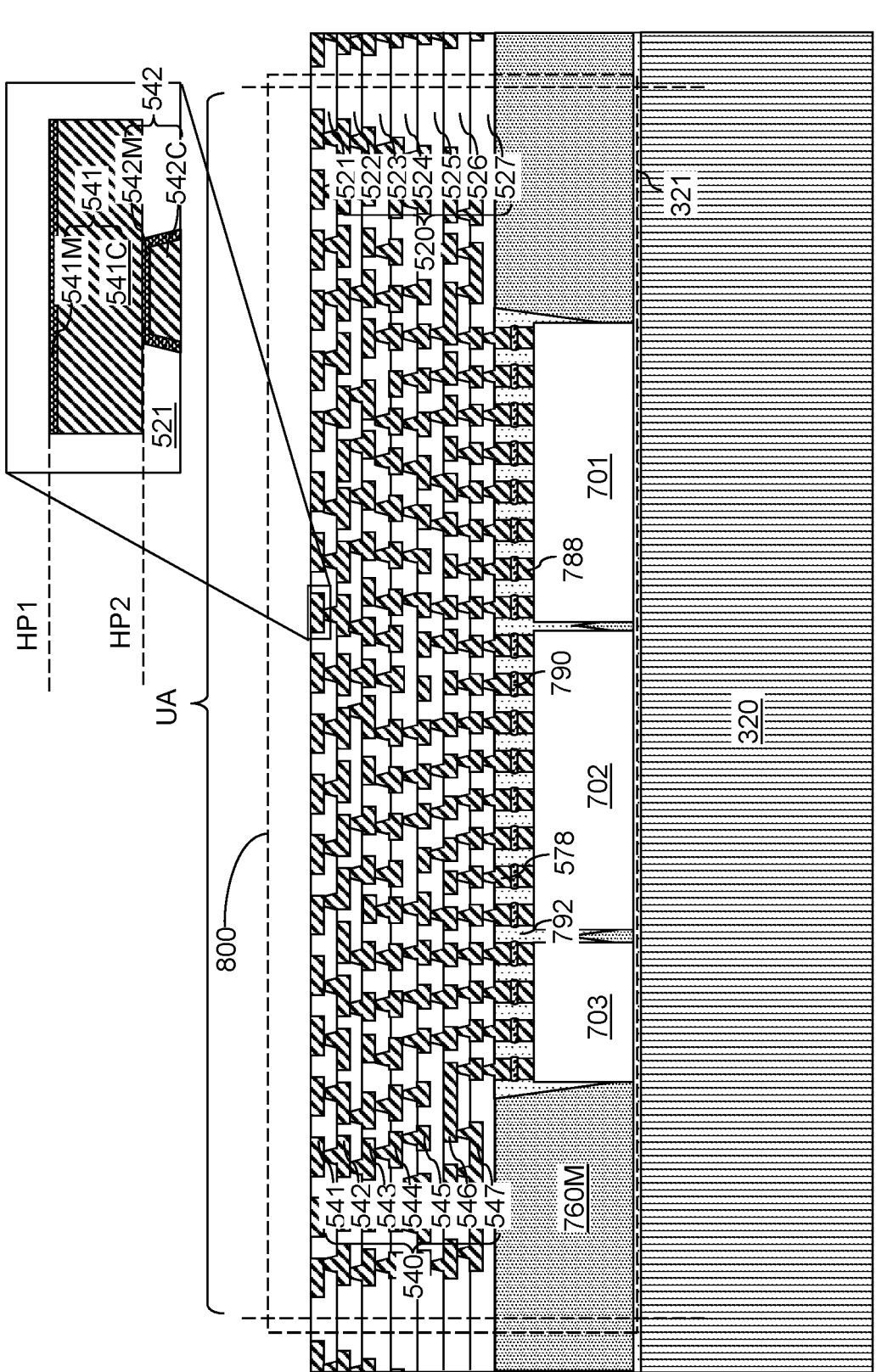
FIG. 7 is a vertical cross-sectional view of the first exemplary structure after detaching the first carrier wafer and removing the first adhesive layer according to the first embodiment of the present disclosure.

Referring to FIG. 7, the first carrier wafer 310 may be detached from the reconstituted wafer. In embodiments in which the first carrier wafer 310 includes an optically transparent material and the first adhesive layer 311 comprises a light-to-heat conversion material, irradiation through the first carrier wafer 310 may be used to detach the first carrier wafer 310. In embodiments in which the first adhesive layer 311 comprises a thermally decomposable adhesive material, an anneal process or a laser irradiation may be used to detach the first carrier wafer 310. A suitable clean process may be performed to remove residual portions of the first adhesive layer 311. Surfaces of the redistribution structures 500' that are located within the first horizontal plane HP1 are physically exposed. For example, first planar surfaces of the first redistribution interconnect structures 541 (such as planar surfaces of the first barrier metal layers 541M) of the redistribution structures 500' are physically exposed. Further, a planar surface of the first redistribution dielectric layer 521 is physically exposed. According to an aspect of the present disclosure, all of the physically exposed first planar surfaces of the first redistribution interconnect structures 541 are located entirely within the first horizontal plane HP1. Absence of any conductive via structures underneath the first horizontal plane HP1 provides the advantage of reducing warpage in the physically exposed surface of the redistribution structures 500'.

Figure 8:
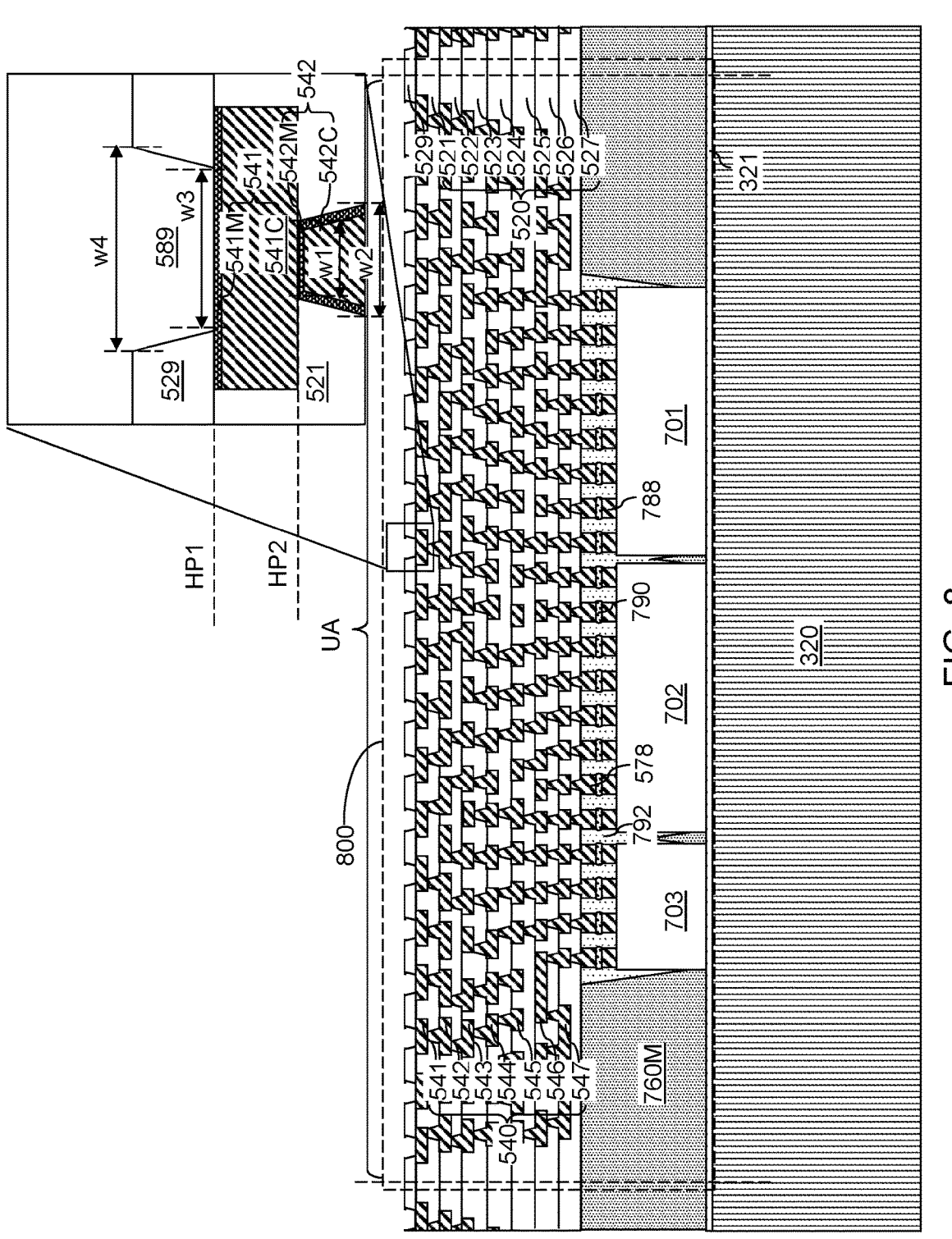
FIG. 8 is a vertical cross-sectional view of the first exemplary structure after formation of a substrate-side dielectric layer and via openings therethrough according to the first embodiment of the present disclosure.

Referring to FIG. 8, a substrate-side dielectric layer 529 may be formed directly on the physically exposed portions of the first redistribution dielectric layer 521 and over the first redistribution interconnect structures 541. Generally, the substrate-side dielectric layer 529 may include any dielectric polymer material that may be used for the first redistribution dielectric layer 521. The material of the substrate-side dielectric layer 529 may be the same as, or may be different from, the material of the first redistribution dielectric layer 521. The thickness of the substrate-side dielectric layer 529 may be in a range from 1 micron to 40 microns, such as from 2 microns to 20 microns, and/or from 4 microns to 10 microns, although lesser and greater thicknesses may also be used.

A photoresist layer (not shown) may be formed over the top surface of the substrate-side dielectric layer 529. The photoresist layer may be lithographically patterned to form openings over areas of underlying first redistribution interconnect structures 541. An anisotropic etch process may be performed to form via openings 589 through the substrate-side dielectric layer 529, and to physically expose top surface segments of the first redistribution interconnect structures 541, such as segments of the planar surfaces of the first barrier metal layers 541M that are located within the first horizontal plane HP1.

Generally, the lateral dimensions of via openings 589 that extend through the substrate-side dielectric layer 529 may be greater than the lateral dimensions of via portions of the second redistribution interconnect structures 542 that contact a respective one of the first redistribution interconnect structures 541. In an illustrative example shown in the inset within FIG. 8, a second redistribution interconnect structure 542 may have a laterally-extending line segment (not shown) and a vertically-extending via portion having a first width w1 at a via bottom and having a second width w2 at the top of the via portion that adjoins the laterally-extending line segment. For example, the first width w1 may be in a range from 5 microns to 20 microns, such as from 8 microns to 15 microns, although lesser and greater first widths w1 may also be used. The second width w2 may be in a range from 5.5 microns to 30 microns, such as from 8.8 microns to 80 microns, although lesser and greater second widths w2 may also be used. The ratio of the first width w1 to the second width w2 may be in a range from 0.2 to 0.9, such as from 0.4 to 0.8, although lesser and greater ratios may also be used.

In the illustrated example shown in the inset within FIG. 8, a via opening 589 vertically extending through the substrate-side dielectric layer 529 may have a third width w3 at a bottom portion that adjoins a first redistribution interconnect structure 541, and a fourth width w4 at a top periphery that adjoins a physically exposed planar top surface of the substrate-side dielectric layer 529. For example, the third width w3 may be in a range from 40 microns to 100 microns, such as from 50 microns to 80 microns, although lesser and greater third widths w3 may also be used. The fourth width w4 may be in a range from 44 microns to 120 microns, such as from 55 microns to 96 microns, although lesser and greater fourth widths w4 may also be used. The ratio of the third width w3 to the fourth width w4 may be in a range from 0.2 to 0.9, such as from 0.4 to 0.8, although lesser and greater ratios may also be used. The ratio of the first width w1 to the third width w3 may be in a range from 0.05 to 0.5. such as from 0.1 to 0.25. Generally, the first width w1 may be smaller than the third width w3 by a factor of at least 2. The first width w1 is representative of the general lateral dimensions of via portions of the redistribution interconnect structures 540, and the third width w3 reflects the general lateral dimensions of via portions of fan-out bump structures to be subsequently formed.

Figure 9:
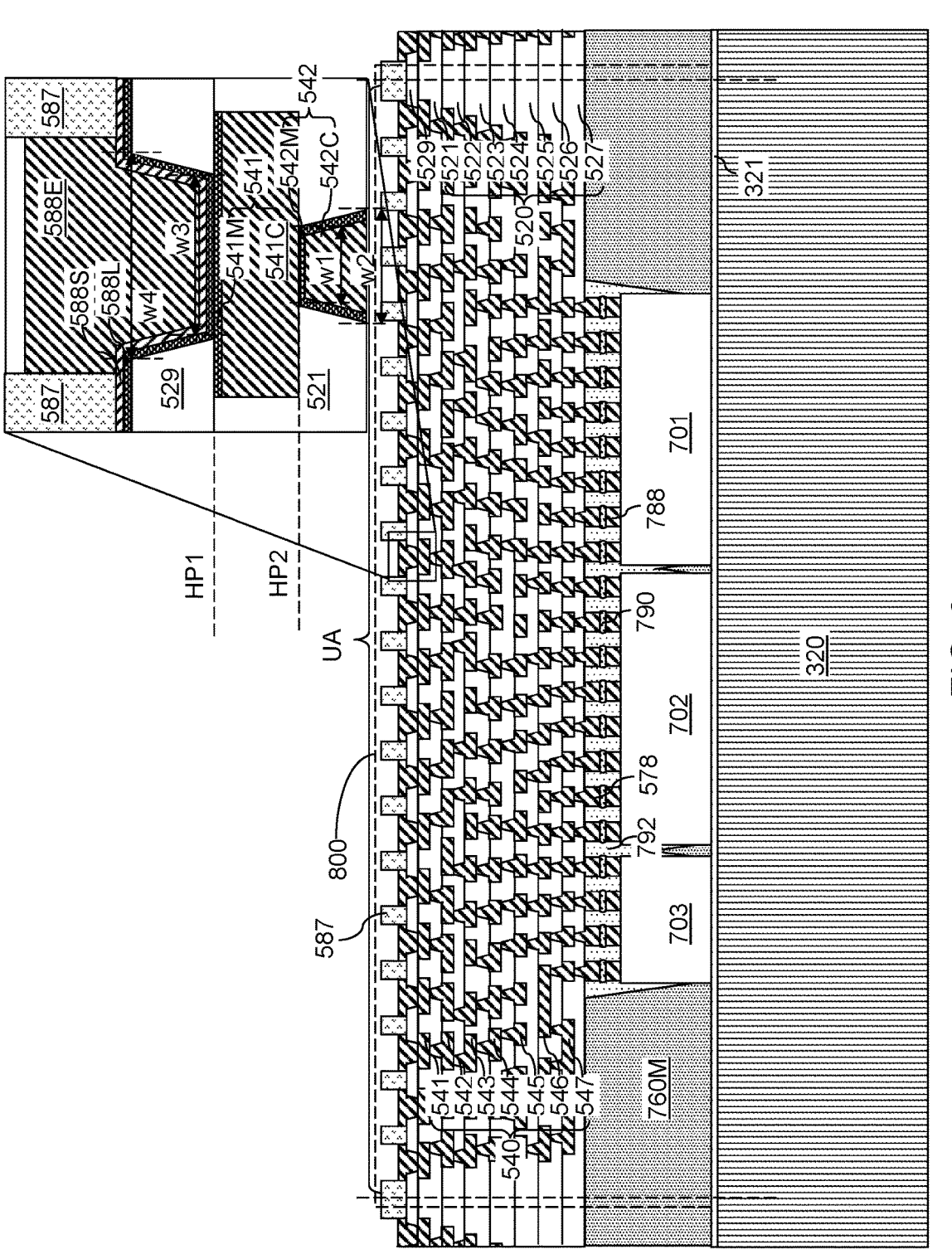
FIG. 9 is a vertical cross-sectional view of the first exemplary structure after formation of a continuous bump barrier metal layer, a continuous bump copper seed layer, a patterned electroplating mask layer, and electroplated bump copper portions in, and over, the via openings through the substrate-side dielectric layer according to the first embodiment of the present disclosure.

Referring to FIG. 9, a continuous bump-level barrier metal layer 588L and a continuous bump-level copper seed layer 588S may be sequentially formed over the substrate-side dielectric layer 529 and in the via openings 589 directly on physically exposed surfaces of the first redistribution interconnect structures 541. The continuous bump-level barrier metal layer 588L is a continuous barrier metal layer that is used to form a portion of each fan-out bump structure. The continuous bump-level barrier metal layer 588L comprises a barrier metallic material such as Ti, Ta, TiN, TaN, WN, or a combination thereof. Other suitable barrier metallic materials are within the contemplated scope of disclosure. The barrier metallic material functions as a diffusion-blocking barrier for copper to be subsequently deposited. The continuous bump-level barrier metal layer 588L may be deposited by a conformal or a non-conformal deposition process. For example, the continuous bump-level barrier metal layer 588L may be deposited by physical vapor deposition or chemical vapor deposition. The thickness of the horizontally-extending portions of the continuous bump-level barrier metal layer 588L may be in a range from 3 nm to 300 nm such as from 10 nm to 100 nm and/or from 20 nm to 50 nm, although lesser and greater thicknesses may also be used. The continuous bump-level barrier metal layer 588L may be deposited directly on first planar surfaces of the first barrier metal layer 541M that are located within the first horizontal plane HP1.

The continuous bump-level copper seed layer 588S is a continuous copper seed layer that is used to form fan-out bump structures. The continuous bump-level copper seed layer 588S comprises, and/or consists essentially of, copper. The continuous bump-level copper seed layer 588S may be deposited, for example, by physical vapor deposition. The thickness of horizontally-extending portions of the continuous bump-level copper seed layer 588S may be in a range from 100 nm to 1,000 nm, such as from 200 nm to 500 nm, although lesser and greater thicknesses may also be used.

A substrate-side patterned electroplating mask layer 587 may be formed over the continuous bump-level copper seed layer 588S. In one embodiment, the substrate-side patterned electroplating mask layer 587 may comprise a patterned photoresist layer. For example, the substrate-side patterned electroplating mask layer 587 may be formed by applying and lithographically patterning a photoresist layer such that opening having straight vertical sidewalls are formed through the photoresist layer. A top surface segment of the bump-level continuous copper seed layer 588S may be physically exposed at the bottom of each opening through the substrate-side patterned electroplating mask layer 587.

An electroplating process may be performed to electroplate copper on physically exposed surfaces of the continuous bump-level copper seed layer 588S within openings through the substrate-side patterned electroplating mask layer 587. Generally, any copper electroplating process known in the art may be used to electroplate copper. Electroplated portions of copper formed within the openings in the substrate-side patterned electroplating mask layer 587 are herein referred to as electroplated copper pad portions 588E. The vertical distance between the top surfaces of the electroplated copper pad portions 588E and the horizontal plane including the top surface of the substrate-side dielectric layer 529 may be in a range from 5 micron to 100 microns, such as from 10 microns to 50 microns, and/or from 15 microns to 30 microns, although lesser and greater vertical distances may also be used.

Figure 10:
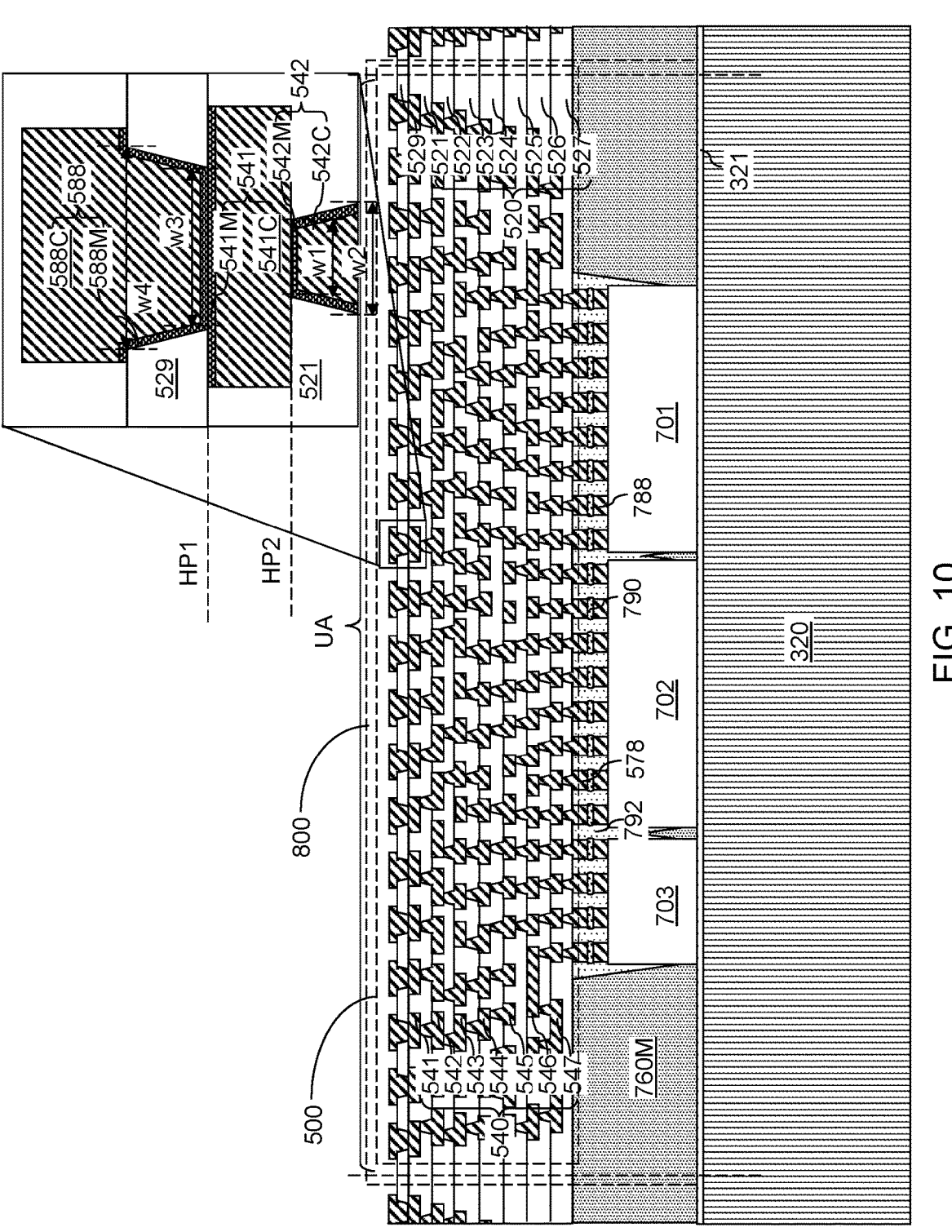
FIG. 10 is a vertical cross-sectional view of the first exemplary structure after formation of fan-out bump structures according to the first embodiment of the present disclosure.

Referring to FIG. 10, the substrate-side patterned electroplating mask layer 587 may be removed, for example, by ashing. At least one etch back process may be performed to remove portions of the continuous bump-level copper seed layer 588S and the continuous bump-level barrier metal layer 588L that are not covered by electroplated portions of copper, i.e., by the electroplated copper pad portions 588E. The at least one etch back process may comprise at least one anisotropic etch process and/or at least one isotropic etch process. Portions of a planar horizontal surface of the substrate-side dielectric layer 529 that do not underlie the electroplated copper pad portions 588E may be physically exposed. Remaining portions of the continuous bump-level barrier metal layer 588L are herein referred to as bump-level barrier metal layers 588M, which are barrier metal layers that are incorporated into a respective fan-out bump structure 588. A thermal anneal process may be performed to induce grain growth in the remaining portions of the continuous bump-level copper seed layer 588S and the electroplated copper pad portions 588E. Copper grains may grow within each contiguous combination of remaining portions of the continuous bump-level copper seed layer 588S and the electroplated copper pad portions 588E. Each contiguous combination of a remaining portion of the continuous bump-level copper seed layer 588S and an electroplated copper pad portion 588E is subsequently used as a copper portion of a respective fan-out bump structure 588, and is herein referred to as a bump copper portion 588C.

Each of the fan-out bump structures 588 may comprise a combination of a bump-level barrier metal layer 588M and a bump copper portion 588C. Each of the fan-out bump structures 588 may be formed on a top surface of a respective first redistribution interconnect structure 541 and on the substrate-side dielectric layer 529. Each of the fan-out bump structures 588 may have a respective planar surface located entirely within the first horizontal plane HP1. Each of the fan-out bump structures 588 may comprise a respective cylindrical portion that overlies a physically-exposed planar horizontal surface of the substrate-side dielectric layer 529 and having vertical sidewalls. The height of the cylindrical portions of the fan-out bump structures 588 may be the same as one another, and may be in a range in a range from 5 micron to 100 microns, such as from 10 microns to 50 microns, and/or from 15 microns to 30 microns, although lesser and greater heights may also be used.

Generally, fan-out bump structures 588 may be formed directly on the physically exposed first planar surfaces of the first redistribution interconnect structures 541. The fan-out bump structures 588 may be formed directly on segments of planar surfaces of the first barrier metal layers 541M of the first redistribution interconnect structures 541 located within the first horizontal plane HP1. In one embodiment, bump-level barrier metal layers 588M of the fan-out bump structures 588 may contact the planar surfaces of the first barrier metal layers 541M of the first redistribution interconnect structures 541 within the first horizontal plane HP1 that is a two-dimensional Euclidean plane.

The first exemplary structure includes a fan-out package 800, such as a two-dimensional array of fan-out packages 800 that are interconnected to one another within a reconstituted wafer. Each fan-out package 800 comprises an interposer, such as an organic interposers 500. Each of the organic interposers 500 may comprise: redistribution interconnect structures 540 laterally surrounded by wiring-level redistribution dielectric layers 520 having a substrate-side planar surface (located within the first plane HP1) and a die-side planar surface (which is in contact with an MC die frame), wherein each tapered via portion of the redistribution interconnect structures 540 has a respective lateral dimension that increases with a distance from a two-dimensional Euclidean plane including the substrate-side planar surface; a substrate-side dielectric layer 529 located on the substrate-side planar surface and including via openings therethrough; and fan-out bump structures 588 located on the substrate-side dielectric layer 529 and comprising a respective via portion filling a respective one of the via openings through the substrate-side dielectric layer 529, wherein each of the via portions of the fan-out bump structures 588 has a respective lateral dimension that increases with a distance from the two-dimensional Euclidean plane including the substrate-side planar surface.

In one embodiment, the redistribution interconnect structures 540 comprise first redistribution interconnect structures 541 in contact with the substrate-side dielectric layer 529; and each of the first redistribution interconnect structures 541 has a respective first planar surface located entirely within the two-dimensional Euclidean plane (such as the first plane HP1) including the substrate-side planar surface and a respective second planar surface located entirely within a horizontal plane (such as a second horizontal plane HP2) that is parallel to the two-dimensional Euclidean plane, the respective second planar surface having a same area as the respective first planar surface for each of the first redistribution interconnect structures 541.

In one embodiment, the redistribution interconnect structures 540 comprise first redistribution interconnect structures 541 in contact with the substrate-side dielectric layer 529; and each of the first redistribution interconnect structures 541 comprises: a respective barrier metal layer (such as a first barrier metal layer 541M) having a planar surface located within the two-dimensional Euclidean plane, and a respective copper portion (such as a first redistribution wiring copper portion 541C) having a uniform thickness throughout.

In one embodiment, each of the fan-out bump structures 588 comprises: a respective bump barrier metal layer (such as a bump-level barrier metal layer 588M) in contact with a respective one of the first redistribution interconnect structures 541, a respective tapered surface of the substrate-side dielectric layer 529, and a respective annular horizontal surface segment of the substrate-side dielectric layer 529; and a respective copper bump portion 588C.

Figure 11:
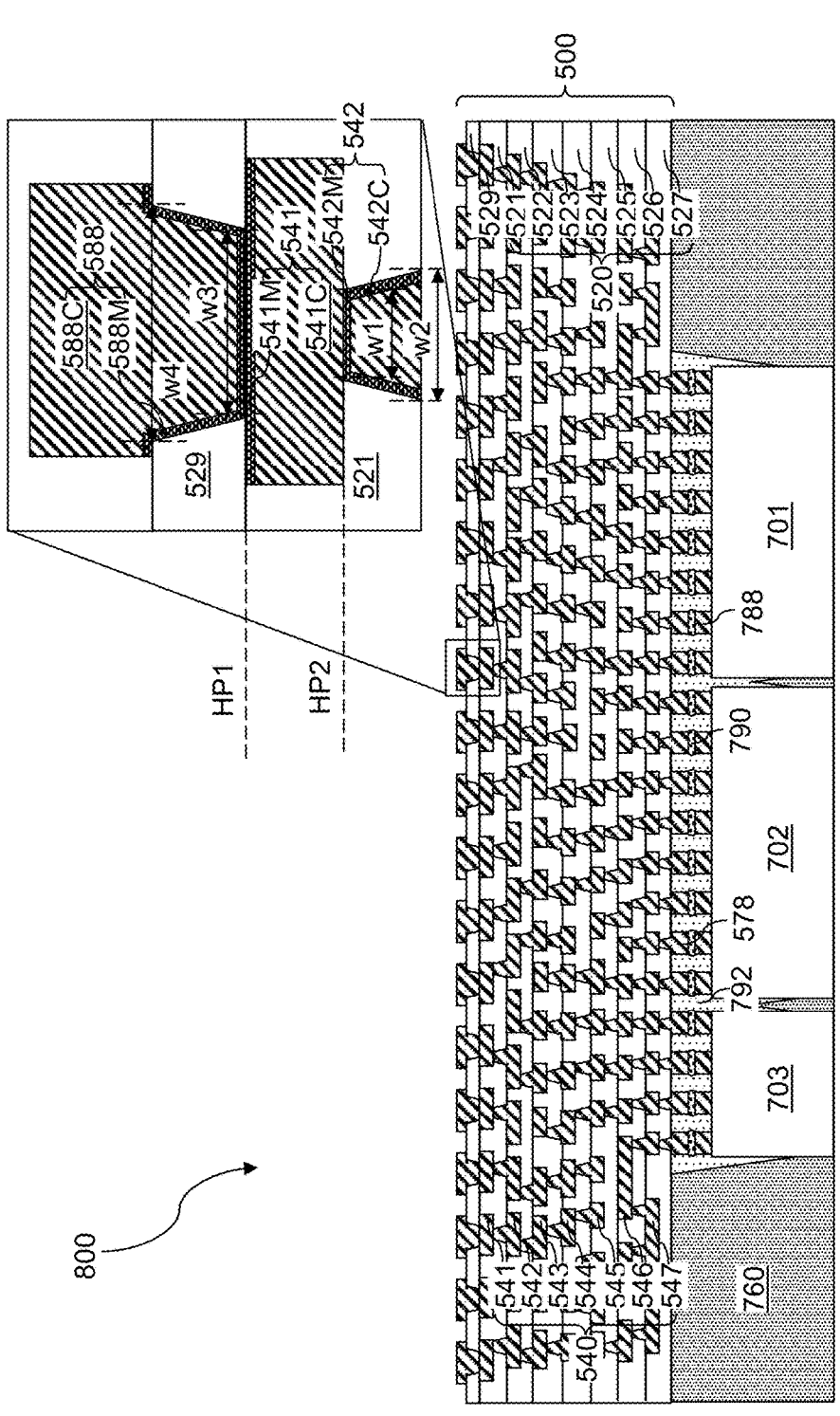
FIG. 11 is a vertical cross-sectional view of the first exemplary structure after detaching the second carrier wafer and dicing a reconstituted wafer into a plurality of fan-out semiconductor dies according to the first embodiment of the present disclosure.

Referring to FIG. 11, the second carrier wafer 320 may be detached from the reconstituted wafer. In embodiments in which the second carrier wafer 320 includes an optically transparent material and the second adhesive layer 321 comprises a light-to-heat conversion material, irradiation through the second carrier wafer 320 may be used to detach the second carrier wafer 320. In embodiments in which the second adhesive layer 321 comprises a thermally decomposable adhesive material, an anneal process or a laser irradiation may be used to detach the second carrier wafer 320. A suitable clean process may be performed to remove residual portions of the second adhesive layer 321. A horizontal surface of the MC matrix 760M may be physically exposed.

The reconstituted wafer includes a two-dimensional array of organic interposers 500, and further includes a two-dimensional array of sets of one or more semiconductor dies (701, 702, 703) that are bonded to a respective organic interposer 500. The reconstituted wafer may be diced along dicing channels by performing a dicing process. The dicing channels correspond to the boundaries between neighboring pairs of unit areas UA. Each diced unit from the reconstituted wafer comprises a fan-out package 800. In other words, each diced portion of the assembly of the two-dimensional array of sets of semiconductor dies (701, 702, 703), the two-dimensional array of die-side underfill material portions 792, the MC matrix 760M, and the two-dimensional array of organic interposers 500 comprises a fan-out package 800. Each diced portion of the MC matrix 760M constitutes a molding compound die frame 760, i.e., an MC die frame 760. Generally, an assembly comprising one or more semiconductor dies (701, 702, 703), an interposer (such as an organic interposer 500), and fan-out bump structures 588 may be provided.

Figure 12:
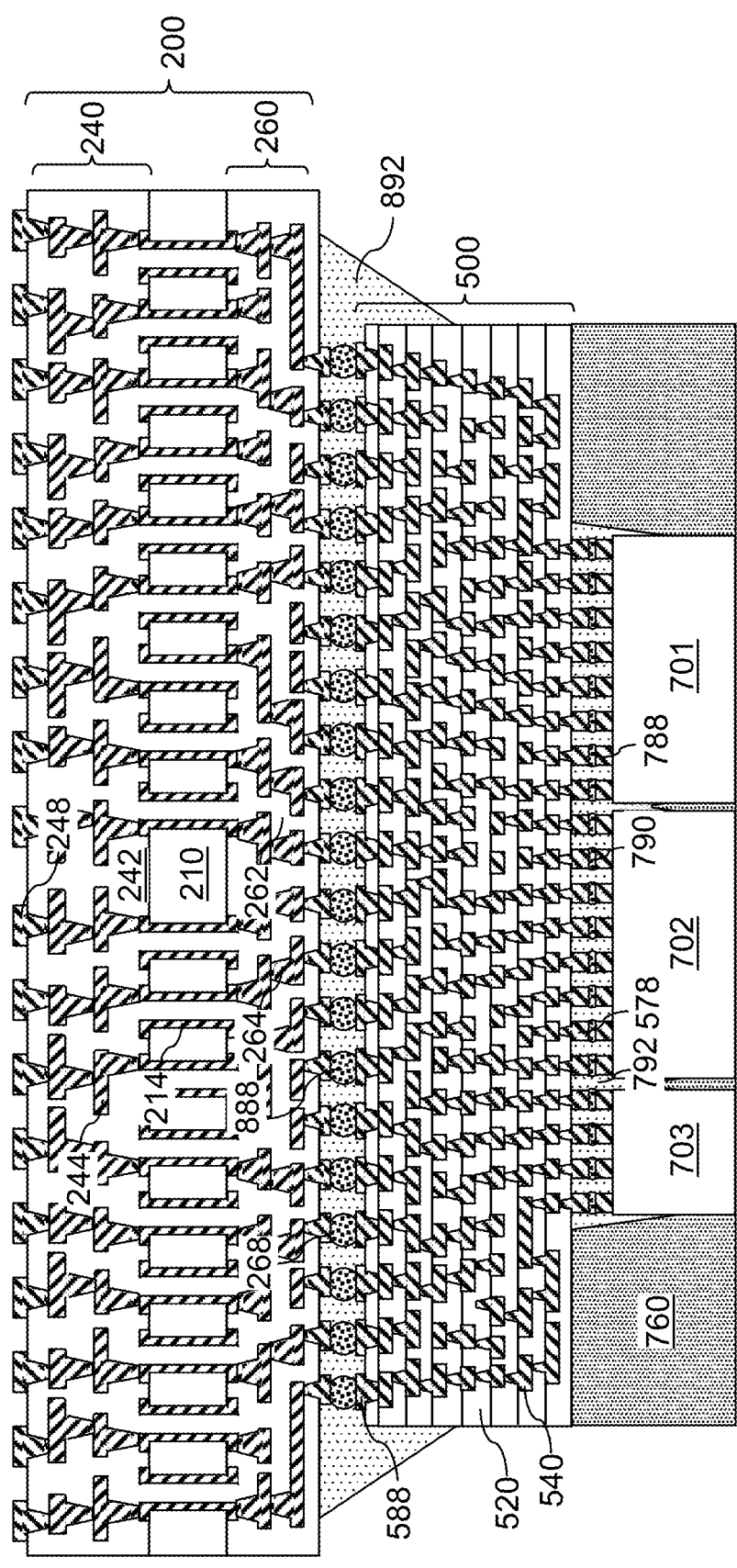
FIG. 12 is a vertical cross-sectional view of the first exemplary structure after attaching a fan-out semiconductor die to a packaging substrate according to the first embodiment of the present disclosure.

Referring to FIG. 12, a packaging substrate 200 may be provided. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers. dielectric interlayers, and/or at least one embedded interposer (such as a silicon interposer). Such a system-integrated packaging substrate may include layer-to-layer interconnections using solder material portions, microbumps, underfill material portions (such as molded underfill material portions), and/or an adhesion film. While the present disclosure is described using a cored packaging substrate, it is understood that the scope of the present disclosure is not limited by any particular type of substrate package. For example, an SoIS may be used in lieu of a cored packaging substrate. In embodiments in which SoIS is used, the core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners (not illustrated) may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side interconnect structures 244. The chip-side SLC 260 may include chip-side insulating layers 262 embedding chip-side interconnect structures 264. The board-side insulating layers 242 and the chip-side insulating layers 262 may include a photosensitive epoxy material that may be lithographically patterned and subsequently cured. The board-side interconnect structures 244 and the chip-side interconnect structures 264 may include copper that may be deposited by electroplating within patterns in the board-side insulating layers 242 or the chip-side insulating layers 262.

In one embodiment, the chip-side surface laminar circuit 260 comprises chip-side interconnect structures 264 that are connected to an array of substrate bonding pads 268. The array of substrate bonding pads 268 may be configured to allow bonding through C4 solder balls. The board-side surface laminar circuit 240 comprises board-side interconnect structures 244 that are connected to an array of board-side bonding pads 248. The array of board-side bonding pads 248 is configured to allow bonding through solder joints having a greater dimension than the C4 solder balls. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

A fan-out package 800 may be attached to the packaging substrate 200 using the solder material portions 888. The solder material portions 888 may be formed on the substrate bonding pads 268 or on the fan-out bump structures 588. Subsequently, each of the solder material portions 888 may be bonded to a respective one of the substrate bonding pads 268 and to a respective one of the fan-out bump structures 588 located on the organic interposer 500. For example, a reflow process may be performed to reflow the solder material portions 888 such that each solder material portion 888 may be bonded to a respective one of the substrate bonding pads 268 and to a respective one of the fan-out bump structures 588.

An underfill material may be applied into a gap between the organic interposer 500 and the packaging substrate 200. The underfill material may comprise any underfill material known in the art. An underfill material portion may be formed around the solder material portions 888 in the gap between the organic interposer 500 and the packaging substrate 200. This underfill material portion may be formed between the organic interposer 500 and the packaging substrate 200, and thus, is herein referred to as an interposer-package underfill material portion 892, or as an IP underfill material portion 892.

A stiffener ring (not shown) may be attached to the physically exposed surface of the molding compound die frame 760 (i.e., an MC die frame 760) using, for example, an adhesive layer (not shown).

Figure 13:
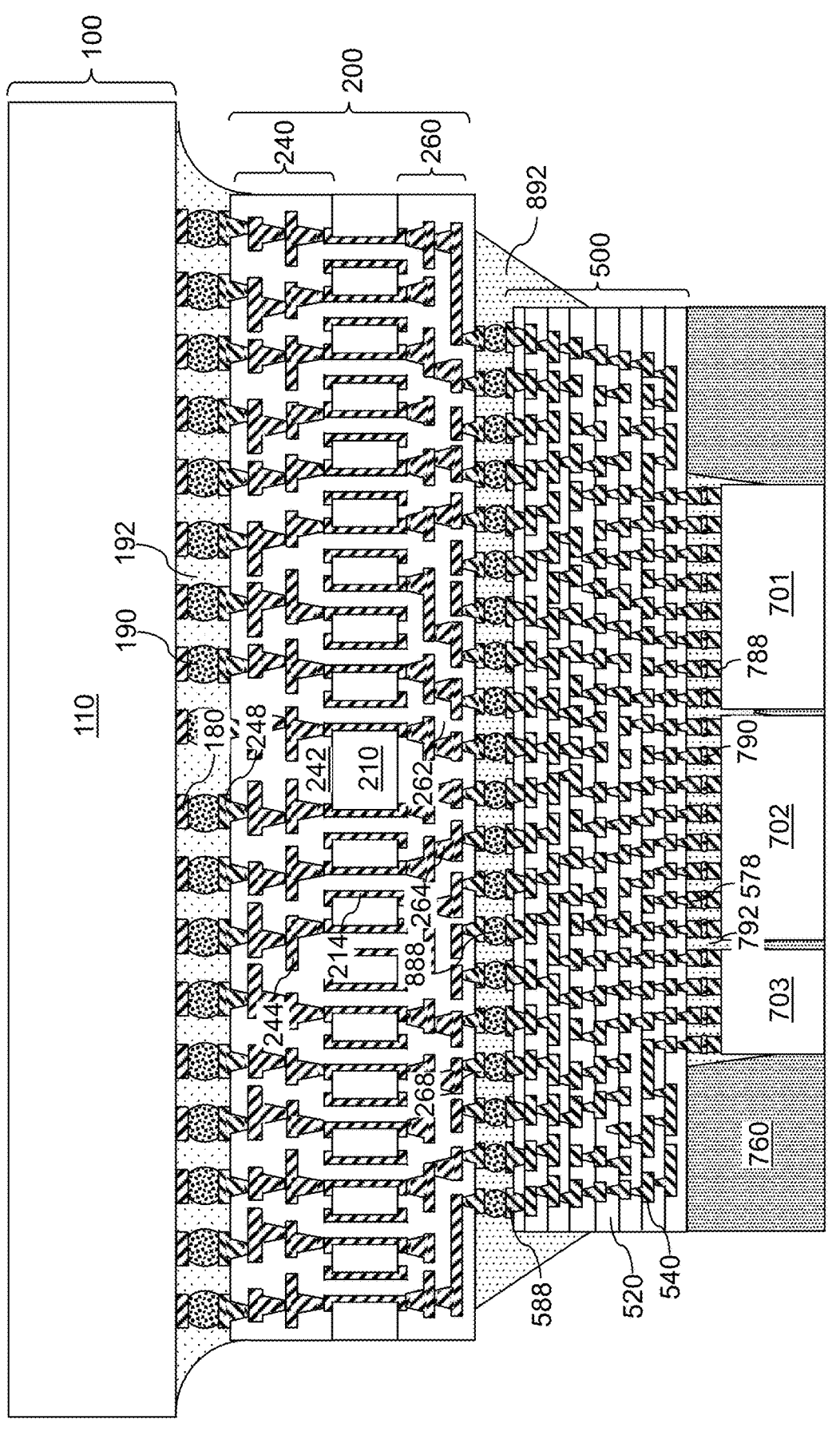
FIG. 13 is a vertical cross-sectional view of the first exemplary structure after attaching the packaging substrate to a printed circuit board according to the first embodiment of the present disclosure.

Referring to FIG. 13, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An additional underfill material portion, which is herein referred to as a board-substrate underfill material portion 192 or a BS underfill material portion 192, may be formed around the solder joints 190 by applying and shaping an underfill material. The packaging substrate 200 is attached to the PCB 100 through the array of solder joints 190.

Generally, a printed circuit board 100 may be bonded to the packaging substrate 200 through an array of solder joints 190. An additional underfill material portion (such as the board-substrate underfill material portion 192) may be formed between the printed circuit board 100 and the packaging substrate 200, and may laterally surround the solder joints 190.

Figure 14:
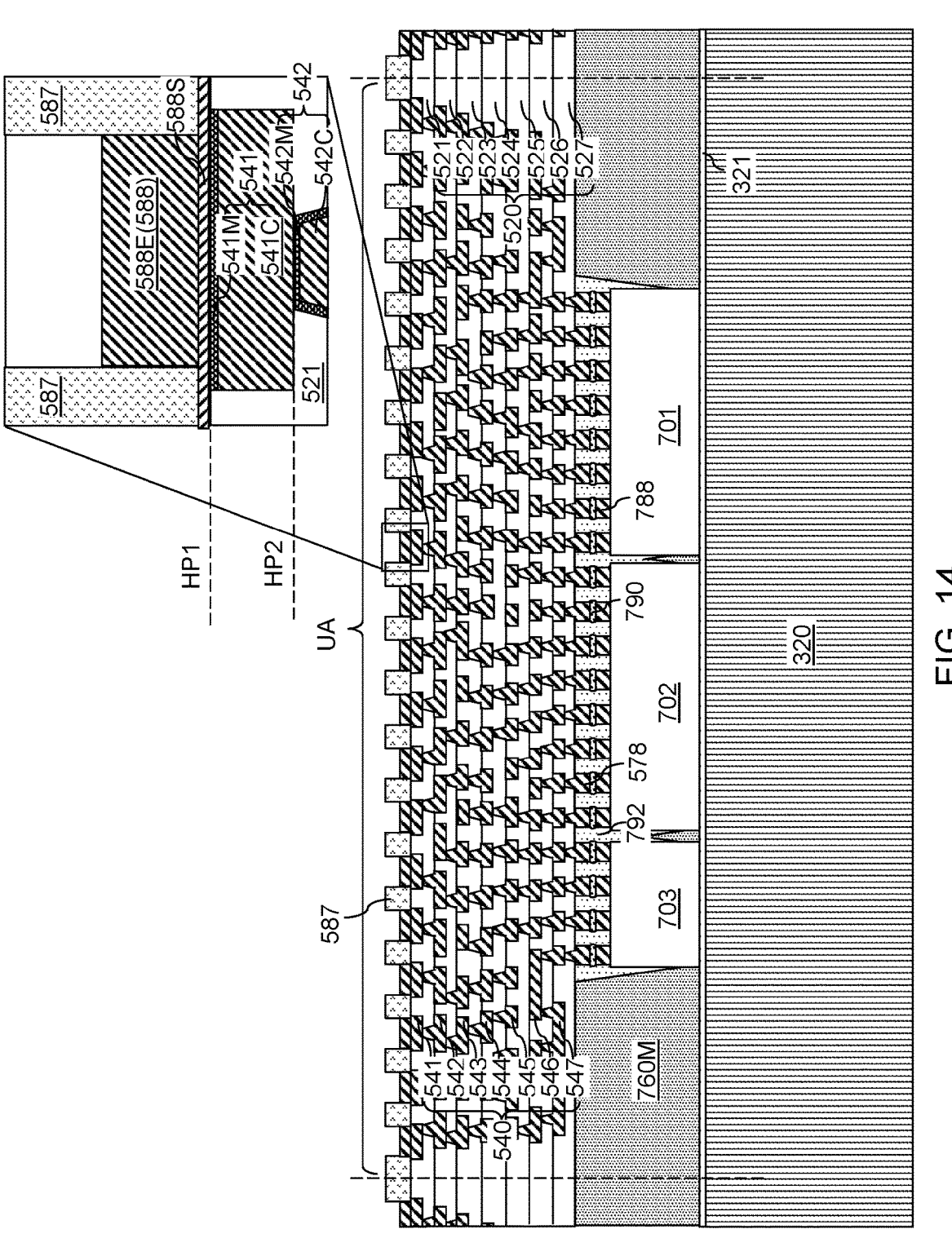
FIG. 14 is a vertical cross-sectional view of a second exemplary structure after formation of a patterned electroplating mask layer and electroplated bump copper portions on first redistribution interconnect structures according to a second embodiment of the present disclosure.

Referring to FIG. 14, a second exemplary structure according to a second embodiment of the present disclosure may be derived from the first exemplary structure illustrated in FIG. 7 by depositing a continuous bump-level copper seed layer 588S, forming a substrate-side patterned electroplating mask layer 587, and forming electroplated copper pad portions 588E.

The continuous bump-level copper seed layer 588S is a continuous copper seed layer that is used to form fan-out bump structures. The continuous bump-level copper seed layer 588S comprises, and/or consists essentially of, copper. The continuous bump-level copper seed layer 588S may be deposited directly on the first planar surfaces of the first redistribution interconnect structures 541 and directly on a planar surface of the first redistribution dielectric layer 521 that are located within the first horizontal plane HP1. The continuous bump-level copper seed layer 588S may be deposited, for example, by physical vapor deposition. The thickness of horizontally-extending portions of the continuous bump-level copper seed layer 588S may be in a range from 100 nm to 1,000 nm, such as from 200 nm to 500 nm, although lesser and greater thicknesses may also be used.

A substrate-side patterned electroplating mask layer 587 may be formed over the continuous bump-level copper seed layer 588S. In one embodiment, the substrate-side patterned electroplating mask layer 587 may comprise a patterned photoresist layer. For example, the substrate-side patterned electroplating mask layer 587 may be formed by applying and lithographically patterning a photoresist layer such that opening having straight vertical sidewalls are formed through the photoresist layer. A top surface segment of the bump-level continuous copper seed layer 588S may be physically exposed at the bottom of each opening through the substrate-side patterned electroplating mask layer 587.

An electroplating process may be performed to electroplate copper on physically exposed surfaces of the continuous bump-level copper seed layer 588S within openings through the substrate-side patterned electroplating mask layer 587. Generally, any copper electroplating process known in the art may be used to electroplate copper. Electroplated portions of copper formed within the openings in the substrate-side patterned electroplating mask layer 587 are herein referred to as electroplated copper pad portions 588E. The vertical distance between the top surfaces of the electroplated copper pad portions 588E and the horizontal plane including the top surface of the substrate-side dielectric layer 529 may be in a range from 5 micron to 100 microns, such as from 10 microns to 50 microns, and/or from 15 microns to 30 microns, although lesser and greater vertical distances may also be used.

Figure 15:
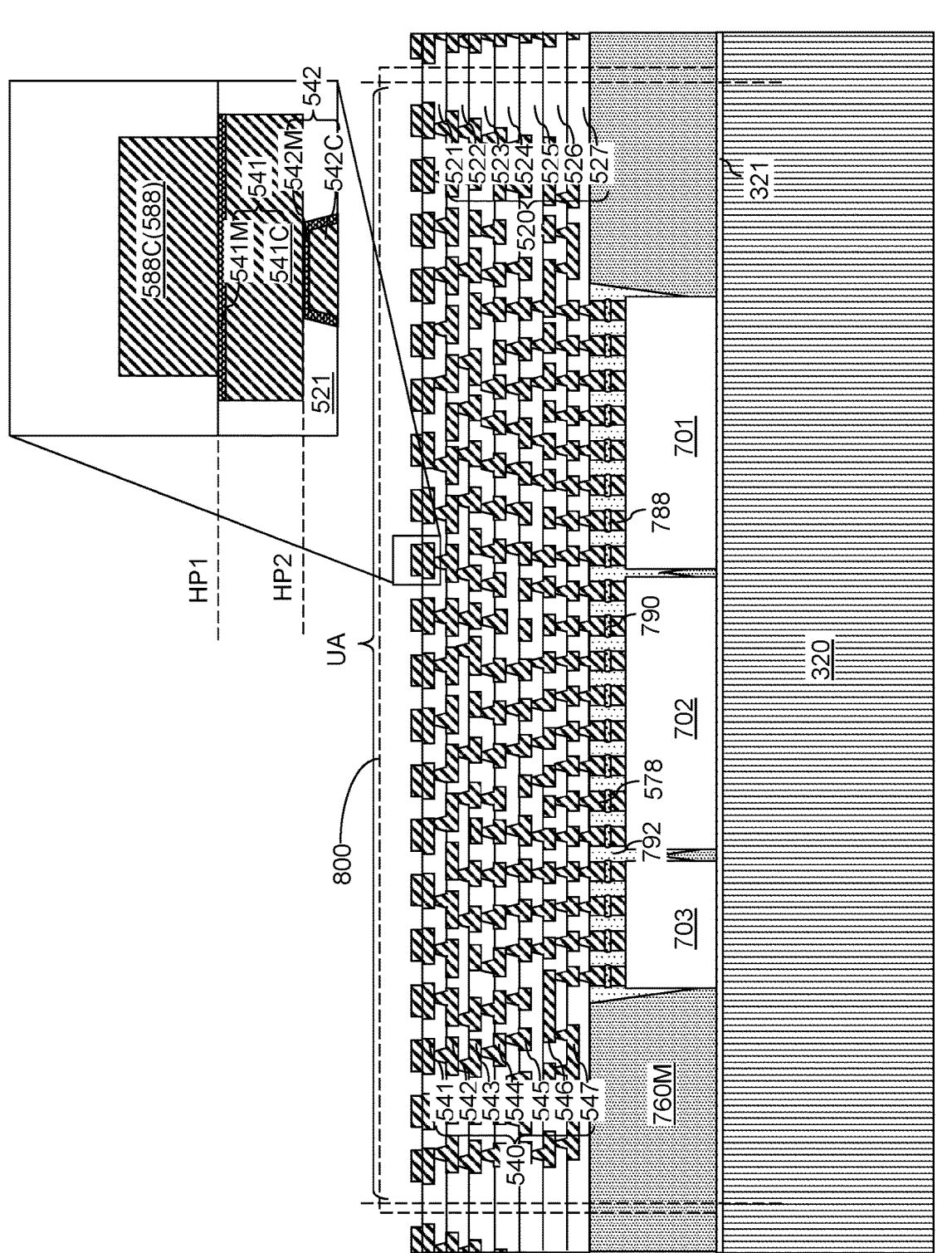
FIG. 15 is a vertical cross-sectional view of the second exemplary structure after formation of fan-out bump structures according to the second embodiment of the present disclosure.

Referring to FIG. 15, the substrate-side patterned electroplating mask layer 587 may be removed, for example, by ashing. An etch back process may be performed to remove portions of the continuous bump-level copper seed layer 588S that are not covered by electroplated portions of copper, i.e., by the electroplated copper pad portions 588E. The etch back process may comprise an anisotropic etch process and/or an isotropic etch process. Portions of a planar horizontal surface of the first redistribution dielectric layer 521 that do not underlie the electroplated copper pad portions 588E may be physically exposed. Further, portions of the first barrier metal layers 541M that do not underlie the electroplated copper pad portions 588E may be physically exposed. Remaining portions of the continuous bump-level barrier metal layer 588L are herein referred to as bump-level barrier metal layers 588M, which are barrier metal layers that are incorporated into a respective fan-out bump structure 588. A thermal anneal process may be performed to induce grain growth in the remaining portions of the continuous bump-level copper seed layer 588S and the electroplated copper pad portions 588E. Copper grains may grow within each contiguous combination of remaining portions of the continuous bump-level copper seed layer 588S and the electroplated copper pad portions 588E. Each contiguous combination of a remaining portion of the continuous bump-level copper seed layer 588S and an electroplated copper pad portion 541E is subsequently used as a copper portion of a respective fan-out bump structure 588, and is herein referred to as a bump copper portion 588C.

Each of the fan-out bump structures 588 consists of a bump copper portion 588C. Each of the fan-out bump structures 588 may be formed on a top surface of a respective first redistribution interconnect structure 541. A periphery of a planar surface of each fan-out bump structure 588 that contacts a respective first redistribution interconnect structure 541 may be laterally offset inward from a periphery of a first planar surface of the respective first redistribution interconnect structure 541 that is located within the first horizontal plane HP1. Each of the fan-out bump structures 588 may have a respective planar surface located entirely within the first horizontal plane HP1. Each of the fan-out bump structures 588 comprises, and consists of, a respective cylindrical portion that overlies a physically-exposed planar horizontal surface of the first redistribution dielectric layer 521 and having vertical sidewalls. The height of the fan-out bump structures 588 may be the same as one another, and may be in a range in a range from 5 micron to 100 microns, such as from 10 microns to 50 microns, and/or from 15 microns to 30 microns, although lesser and greater heights may also be used.

Generally, fan-out bump structures 588 may be formed directly on the physically exposed first planar surfaces of the first redistribution interconnect structures 541. The fan-out bump structures 588 may be formed directly on segments of planar surfaces of the first barrier metal layers 541M of the first redistribution interconnect structures 541 located within the first horizontal plane HP1. In one embodiment, the bump copper portions 588C of the fan-out bump structures 588 may contact the planar surfaces of the first barrier metal layers 541M of the first redistribution interconnect structures 541 within the first horizontal plane HP1 that is a two-dimensional Euclidean plane.

The second exemplary structure includes a fan-out package 800, such as a two-dimensional array of fan-out packages 800 that are interconnected to one another within a reconstituted wafer. Each fan-out package 800 comprises an interposer, such as an organic interposers 500. Each of the organic interposers 500 may comprise: redistribution interconnect structures 540 laterally surrounded by wiring-level redistribution dielectric layers 520 having a substrate-side planar surface (located within a first horizontal plane HP1) and a die-side planar surface, wherein each tapered via portion of the redistribution interconnect structures 540 has a respective lateral dimension that increases with a distance from a two-dimensional Euclidean plane including the substrate-side planar surface; and fan-out bump structures 588 located on the substrate-side planar surface and comprising a respective cylindrical sidewall and a respective planar surface that is located entirely within the two-dimensional Euclidean plane.

In one embodiment, the respective planar surface comprises a respective planar copper surface in direct contact with a respective one of the redistribution interconnect structures 540 (such as a respective one of the first redistribution interconnect structures 541).

In one embodiment, each of the fan-out bump structures 588 consists of a respective bump copper portion 588C having a uniform thickness throughout.

In one embodiment, the redistribution interconnect structures 540 comprise first redistribution interconnect structures 541; and each of the first redistribution interconnect structures 541 comprises: a respective barrier metal layer (such as a first barrier metal layer 541M) having a planar surface located within the two-dimensional Euclidean plane and in contact with a respective one of the bump copper portions 588C of the fan-out bump structures 588, and a respective copper portion (such as a first redistribution wiring copper portion 541C) having a uniform thickness throughout.

Figure 16:
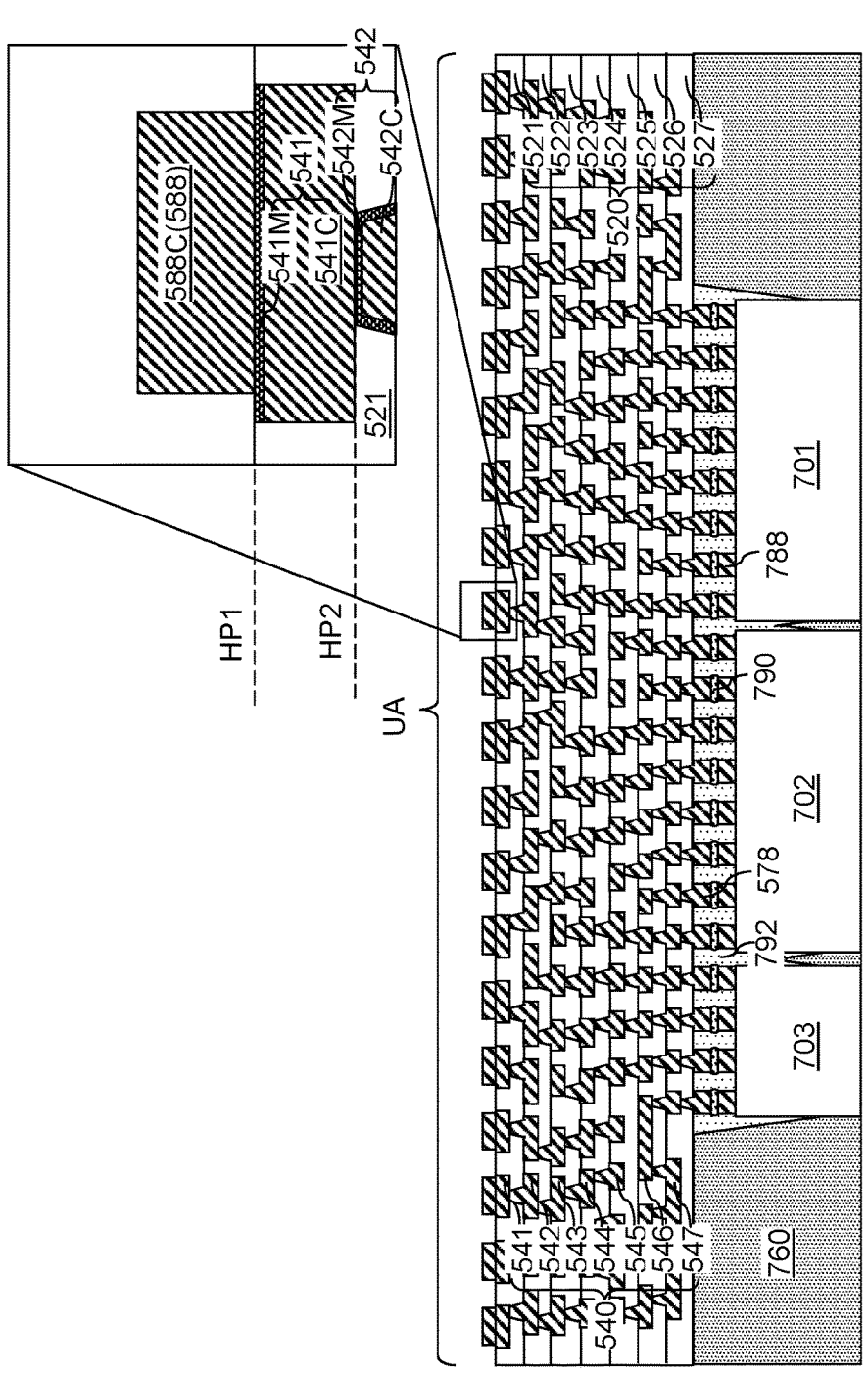
FIG. 16 is a vertical cross-sectional view of the second exemplary structure after detaching the second carrier wafer and dicing a reconstituted wafer into a plurality of fan-out semiconductor dies according to the second embodiment of the present disclosure.

Referring to FIG. 16, the second carrier wafer 320 may be detached from the reconstituted wafer. A horizontal surface of the MC matrix 760M may be physically exposed. The reconstituted wafer includes a two-dimensional array of organic interposers 500, and further includes a two-dimensional array of sets of one or more semiconductor dies (701, 702, 703) that are bonded to a respective organic interposer 500. The reconstituted wafer may be diced along dicing channels by performing a dicing process. Each diced unit from the reconstituted wafer comprises a fan-out package 800. Generally, an assembly comprising one or more semiconductor dies (701, 702, 703), an interposer (such as an organic interposer 500), and fan-out bump structures 588 may be provided.

Figure 17:
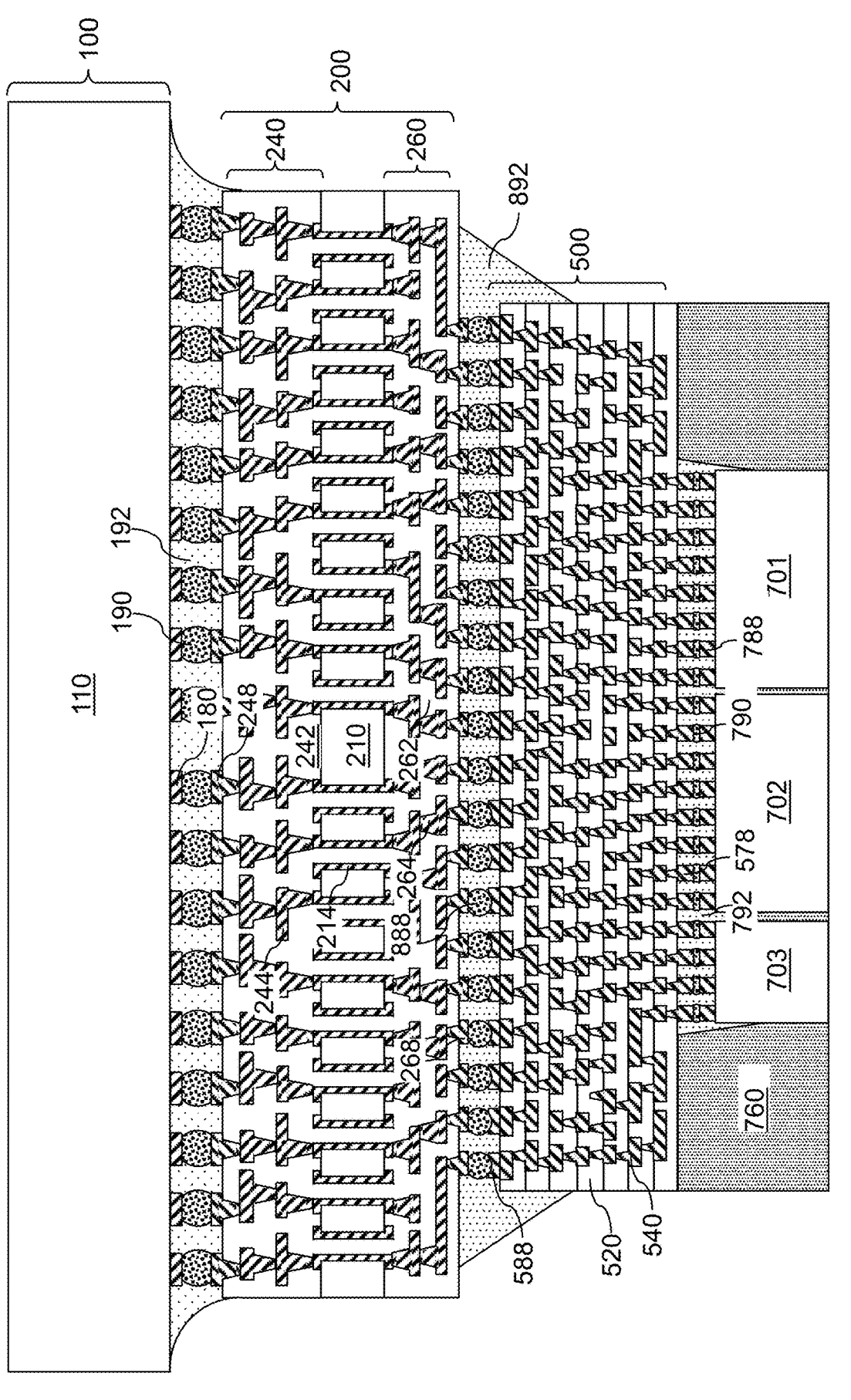
FIG. 17 is a vertical cross-sectional view of the second exemplary structure after attaching a fan-out semiconductor die and a packaging substrate to a printed circuit board according to the second embodiment of the present disclosure.

Referring to FIG. 17, the processing steps of FIG. 12 may be performed to attach a fan-out package 800 to a packaging substrate 200. The interposer-package underfill material portion 892 may directly contact a peripheral portion of a first planar surface of one, a plurality, or each, of the first barrier metal layers 541M. A central portion of each first planar surface of the first barrier metal layers 541M may contact a planar copper surface of a respective bump copper portion 588C, which may be the entirety of a fan-out bump structure 588.

Subsequently, the processing steps of FIG. 13 may be performed to attach the packaging substrate 200 to a printed circuit board 100.

FIG. 18 is a flowchart illustrating steps for forming exemplary structures according to an embodiment of the present disclosure.

Referring to step 1810 and FIGS. 1 and 2, first redistribution interconnect structures 541 may be formed on a top surface of a first adhesive layer 311 over a first carrier wafer 310. Each of the first redistribution interconnect structures 541 has a respective first planar surface located entirely within a first horizontal plane HP1 and a respective second planar surface located entirely within a second horizontal plane HP2. The respective second planar surface may have a same area as the respective first planar surface for each of the first redistribution interconnect structures 541.

Referring to step 1820 and FIGS. 2 and 3, redistribution dielectric layers 520 and additional redistribution interconnect structures (542, 543, 544, 545, 546, 547) may be formed over the first redistribution interconnect structures 541. At least one redistribution structure 500' including a respective subset of the first redistribution interconnect structures 541, a respective portion of the redistribution dielectric layers 520, and a respective subset of the additional redistribution interconnect structures (542, 543, 544, 545, 546, 547) is formed.

Referring to step 1830 and FIG. 4, a respective set of one or more semiconductor dies (701, 702, 703) may be attached to each of the at least one redistribution structure 500'.

Referring to step 1840 and FIGS. 5-7, the first planar surfaces of the first redistribution interconnect structures 541 are physically exposed by removing the first carrier wafer 310 and the first adhesive layer 311.

Referring to step 1850 and FIGS. 8-17, fan-out bump structures 588 may be formed on the physically exposed first planar surfaces of the first redistribution interconnect structures 541.

Referring to all drawings and according to various embodiments of the present disclosure, a method of forming a semiconductor structure is provided, wherein the method includes the steps of: forming first redistribution interconnect structures 541 of an interposer on a top surface of a first adhesive layer 311 over a first carrier wafer 310, wherein each of the first redistribution interconnect structures 541 has a respective first planar surface located entirely within a first horizontal plane HP1 and a respective second planar surface located entirely within a second horizontal plane HP2, the respective second planar surface having a same area as the respective first planar surface for each of the first redistribution interconnect structures 541; forming redistribution dielectric layers 520 and additional redistribution interconnect structures (542, 543, 544, 545, 546, 547) over the first redistribution interconnect structures 541, whereby at least one redistribution structure 500' including a respective subset of the first redistribution interconnect structures 541, a respective portion of the redistribution dielectric layers 520, and a respective subset of the additional redistribution interconnect structures (542, 543, 544, 545, 546, 547) is formed; attaching a respective set of one or more semiconductor dies (701, 702, 703) to each of the at least one redistribution structure 500'; physically exposing the first planar surfaces of the first redistribution interconnect structures 541 by removing the first carrier wafer 310 and the first adhesive layer 311; and forming fan-out bump structures 588 on the physically exposed first planar surfaces of the first redistribution interconnect structures 541.

In one embodiment, all of the physically exposed first planar surfaces of the first redistribution interconnect structures 541 are located entirely within the first horizontal plane HP1. In one embodiment, the method may also include the steps of: depositing a first continuous barrier metal layer 541L and a first continuous copper seed layer 541S over the top surface of the first adhesive layer 311; forming a first patterned electroplating mask layer 517 over the first continuous copper seed layer 541S; electroplating copper on physically exposed surfaces of the first continuous copper seed layer 541S within openings through the first patterned electroplating mask layer 517; and removing the first patterned electroplating mask layer 517 and portions of the first continuous copper seed layer 541S and the first continuous barrier metal layer 541L that are not covered by electroplated portions of copper 541E. In one embodiment, each of the first redistribution interconnect structures 541 comprises a vertical stack of a respective first barrier metal layer 541M and a first copper plate portion; and planar surfaces of the first barrier metal layer 541M are formed directly on the top surface of the first adhesive layer 311 within the first horizontal plane HP1. In one embodiment, the planar surfaces of the first redistribution interconnect structures 541 are physically exposed upon removal of the first adhesive layer 311; and the fan-out bump structures 588 are formed directly on the planar surfaces of the first redistribution interconnect structures 541. In one embodiment, the method may also include the step of: forming on-interposer bump structures 578 on topmost redistribution interconnect structures 547 of the additional redistribution interconnect structures (543, 544, 545, 546, 547), wherein each set of the one or more semiconductor dies (701, 702, 703) is attached to a respective subset of the on-interposer bump structures 578. In one embodiment, the at least one redistribution structure 500' comprises a two-dimensional array of redistribution structures; a two-dimensional array of sets one or more semiconductor dies (701, 702, 703) is attached to the two-dimensional array of redistribution structures; and the method may include dicing the two-dimensional array of redistribution structures, whereby a plurality of fan-out semiconductor dies is formed. In one embodiment, the method may also include forming a molding compound matrix 760M around the two-dimensional array of semiconductor die sets (701, 702, 703), wherein each of the plurality of fan-out semiconductor dies comprises a molding compound die frame that includes a respective diced portion of the molding compound matrix 760M. In one embodiment, the method may also include: forming a substrate-side dielectric layer 529 directly on the first redistribution interconnect structures 541; and forming via openings 589 through the substrate-side dielectric layer 529, wherein the fan-out bump structures 588 fill the via openings 589. In one embodiment, the method may also include: depositing a continuous bump-level barrier metal layer 588L and a continuous bump-level copper seed layer 588S over the first planar surfaces of the first redistribution interconnect structures 541; forming a patterned electroplating mask layer 587 over the continuous bump-level copper seed layer 588S; electroplating copper on physically exposed surfaces of the continuous bump-level copper seed layer 588S within openings 589 through the patterned electroplating mask layer 587; and removing the patterned electroplating mask layer 587 and portions of the continuous copper seed layer 541S and the continuous bump-level copper seed layer 588S that are not covered by electroplated portions of copper 588E. In one embodiment, each of the fan-out bump structures 588 comprises a respective copper portion that formed directly on the first planar surface of a respective one of the first redistribution interconnect structures 541. In one embodiment, the method may include: depositing a continuous copper seed layer 541S directly on the first planar surfaces of the first redistribution interconnect structures 541; forming a patterned electroplating mask layer 517 over the continuous copper seed layer 541S; electroplating copper on physically exposed surfaces of the continuous copper seed layer 541S within openings through the patterned electroplating mask layer 517; and removing the patterned electroplating mask layer 517 and portions of the continuous copper seed layer 541S that are not covered by electroplated portions of copper.

Referring to all drawings and according to various embodiments of the present disclosure, a semiconductor structure may be provided that includes an interposer, the interposer may include: redistribution interconnect structures 540 laterally surrounded by wiring-level redistribution dielectric layers 520 having a substrate-side planar surface and a die-side planar surface, wherein each tapered via portion of the redistribution interconnect structures 540 has a respective lateral dimension that increases with a distance from a two-dimensional Euclidean plane including the substrate-side planar surface; a substrate-side dielectric layer 529 located on the substrate-side planar surface and including via openings 589 therethrough; and fan-out bump structures 588 located on the substrate-side dielectric layer 529 and comprising a respective via portion filling a respective one of the via openings 589 through the substrate-side dielectric layer 529, wherein each of the via portions of the fan-out bump structures 588 has a respective lateral dimension that increases with a distance from the two-dimensional Euclidean plane including the substrate-side planar surface.

In one embodiment, the redistribution interconnect structures 540 comprise first redistribution interconnect structures 541 in contact with the substrate-side dielectric layer 529; and each of the first redistribution interconnect structures 541 has a respective first planar surface located entirely within the two-dimensional Euclidean plane including the substrate-side planar surface and a respective second planar surface located entirely within a horizontal plane that is parallel to the two-dimensional Euclidean plane, the respective second planar surface having a same area as the respective first planar surface for each of the first redistribution interconnect structures 541. In one embodiment, the redistribution interconnect structures 540 may include first redistribution interconnect structures 541 in contact with the substrate-side dielectric layer 529; and each of the first redistribution interconnect structures 541 may include: a respective barrier metal layer 541M having a planar surface located within the two-dimensional Euclidean plane, and a respective copper portion having a uniform thickness throughout. In one embodiment, each of the fan-out bump structures 588 may include: a respective bump barrier metal layer in contact with a respective one of the first redistribution interconnect structures 541, a respective tapered surface of the substrate-side dielectric layer 529, and a respective annular horizontal surface segment of the substrate-side dielectric layer 529; and a respective copper bump portion.

Referring to all drawings and according to various embodiments of the present disclosure, a semiconductor structure may be provided that includes an interposer, the interposer may include: redistribution interconnect structures 540 laterally surrounded by wiring-level redistribution dielectric layers 520 having a substrate-side planar surface and a die-side planar surface, wherein each tapered via portion of the redistribution interconnect structures 540 has a respective lateral dimension that increases with a distance from a two-dimensional Euclidean plane including the substrate-side planar surface; and fan-out bump structures 588 located on the substrate-side planar surface and comprising a respective cylindrical sidewall and a respective planar surface that is located entirely within the two-dimensional Euclidean plane.

In one embodiment, the respective planar surface comprises a respective planar copper surface in direct contact with a respective one of the redistribution interconnect structures 540. In one embodiment, each of the fan-out bump structures 588 consists of a respective bump copper portion having a uniform thickness throughout. In one embodiment, the redistribution interconnect structures 540 may include first redistribution interconnect structures 541; and each of the first redistribution interconnect structures 541 may include: a respective barrier metal layer 541M having a planar surface located within the two-dimensional Euclidean plane and in contact with a respective one of the bump copper portions 588C of the fan-out bump structures 588, and a respective copper portion having a uniform thickness throughout.

According to an aspect of the present disclosure, semiconductor structure comprising an interposer is provided. The interposer comprises: a set of redistribution dielectric layers 520 having a substrate-side planar surface and a die-side planar surface; redistribution interconnect structures 540 laterally surrounded by the set of redistribution dielectric layers 520, the redistribution interconnect structures 540 comprising redistribution wire portions and tapered via portions, wherein each of the tapered via portions has a respective lateral dimension that increases with a distance from the substrate-side planar surface; a substrate-side dielectric layer 529 located on the substrate-side planar surface; and bump structures 588 located on the substrate-side dielectric layer 529 and comprising via portions passing through the substrate-side dielectric layer 529, wherein the via portion of the bump structures 588 have a respective lateral dimension that increases with a distance from the substrate-side planar surface.

In one embodiment, the redistribution interconnect structures 540 comprise first redistribution interconnect structures 541 in contact with the substrate-side dielectric layer 529; and each of the first redistribution interconnect structures 541 has a respective first planar surface located entirely within a first horizontal plane HP1 including the substrate-side planar surface and a respective second planar surface located entirely within a second horizontal plane HP2 that is parallel to the substrate-side planar surface, the respective second planar surface having a same area as the respective first planar surface for each of the first redistribution interconnect structures 541.

In one embodiment, the redistribution interconnect structures 540 comprise first redistribution interconnect structures 541 in contact with the substrate-side dielectric layer 529; and each of the first redistribution interconnect structures 541 comprises: a respective barrier metal layer 541M having a planar surface located within the first horizontal plane HP1, and a respective copper portion 541C having a uniform thickness throughout.

In one embodiment, each of the bump structures 588 comprises: a respective bump barrier metal layer 588M in contact with a respective one of the first redistribution interconnect structures 541, a respective tapered surface of the substrate-side dielectric layer 529, and a respective annular horizontal surface segment of the substrate-side dielectric layer 529; and a respective copper bump portion 588C.

According to an aspect of the present disclosure, a semiconductor structure comprising an interposer is provided. The interposer comprises: a set of redistribution dielectric layers 520 having a substrate-side planar surface and a die-side planar surface; redistribution interconnect structures 540 laterally surrounded by the set of redistribution dielectric layers 520, a subset of the redistribution interconnect structures 540 comprising redistribution wire portions and tapered via portions, wherein each of the tapered via portions has a respective lateral dimension that increases with a distance from the substrate-side planar surface; a solder material portion 888 located over the substrate-side planar surface; and a bump structure 588 in direct contact with a redistribution wire portion of one of the redistribution interconnect structures 540 and in direct contact with the solder material portion, the bump structure 588 comprising a sidewall that is perpendicular to, and in physical contact with, the redistribution wire portion of the one of the redistribution interconnect structures 540 (such as a first redistribution interconnect structure 541).

In one embodiment, an entirety of a surface of the bump structure 588 that is in direct contact with the redistribution wire portion of the one of the redistribution interconnect structures 540 (such as the first redistribution interconnect structure 541) is a planar copper surface.

In one embodiment, the bump structures 588 consists of a bump copper portion 588C having a uniform thickness throughout.

In one embodiment, the redistribution interconnect structures 540 comprise first redistribution interconnect structures 541; the semiconductor structure comprises a plurality of bump structures 588 including the bump structure 588; each of the first redistribution interconnect structures 541 comprises a respective barrier metal layer 541M having a planar surface located within the substrate-side planar surface and in contact with a respective bump structure 588 among the plurality of bump structures 588; each of the plurality of bump structures 588 comprises a respective copper portion 588C having a uniform thickness throughout.

The various embodiments of the present disclosure provide organic interposers 500 in which the fan-out bump structures 588 are formed after the first carrier wafer 310 is detached from the reconstituted wafer. The absence of any embedded via pad in the first redistribution dielectric layer 521 decreases stress and deformation within the first redistribution dielectric layer 521. In embodiments in which the substrate-side dielectric layer 529 is used, the substrate-side redistribution layer 529 may be used as a stress buffer layer. The height of the fan-out bump structures 588 may be selected as needed without concern for deformation at the level of the first redistribution dielectric layer 521. The manufacturing processes of the present disclosure may be lower than prior art manufacturing processes that uses embedded via pads in a first redistribution dielectric layer because a photolithographic patterning step may be omitted. Electrical yield for contacts between the fan-out bump structures 588 and underlying redistribution interconnect structures may also be enhanced through reduction of stress around the fan-out bump structures 588.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:

forming first redistribution interconnect structures of an interposer on a top surface of a first adhesive layer over a first carrier wafer, wherein each of the first redistribution interconnect structures has a respective first planar surface located entirely within a first horizontal plane and a respective second planar surface located entirely within a second horizontal plane, the respective second planar surface having a same area as the respective first planar surface for each of the first redistribution interconnect structures;

forming redistribution dielectric layers and additional redistribution interconnect structures over the first redistribution interconnect structures, whereby at least one redistribution structure including a respective subset of the first redistribution interconnect structures, a respective portion of the redistribution dielectric layers, and a respective subset of the additional redistribution interconnect structures is formed;

attaching a respective set of one or more semiconductor dies to each of the at least one redistribution structure while the first adhesive layer and the first carrier wafer are attached to a backside of the at least one redistribution structure;

physically exposing the first planar surfaces of the first redistribution interconnect structures by removing the first carrier wafer and the first adhesive layer after the respective set of one or more semiconductor dies is attached to each of the at least one redistribution structure; and forming fan-out bump structures on the physically exposed first planar surfaces of the first redistribution interconnect structures.

2. The method of claim 1, wherein all of the physically exposed first planar surfaces of the first redistribution interconnect structures are located entirely within the first horizontal plane.

3. The method of claim 1, further comprising:

depositing a first continuous barrier metal layer and a first continuous copper seed layer over the top surface of the first adhesive layer;

forming a first patterned electroplating mask layer over the first continuous copper seed layer; electroplating copper on physically exposed surfaces of the first continuous copper seed layer within openings through the first patterned electroplating mask layer; and removing the first patterned electroplating mask layer and portions of the first continuous copper seed layer and the first continuous barrier metal layer that are not covered by electroplated portions of copper.

4. The method of claim 1, wherein:

each of the first redistribution interconnect structures comprises a vertical stack of a respective first barrier metal layer and a first copper plate portion; and planar surfaces of the first barrier metal layer are formed directly on the top surface of the first adhesive layer within the first horizontal plane.

5. The method of claim 4, wherein: the planar surfaces of the first redistribution interconnect structures are physically exposed upon removal of the first adhesive layer; and the fan-out bump structures are formed directly on the planar surfaces of the first redistribution interconnect structures.

6. The method of claim 1, further comprising forming on-interposer bump structures on topmost redistribution interconnect structures to the additional redistribution interconnect structures, wherein each set of the one or more semiconductor dies is attached to a respective subset of the on-interposer bump structures.

7. The method of claim 1, wherein:

the at least one redistribution structure comprises a two-dimensional array of redistribution structures; a two-dimensional array of sets one or more semiconductor dies is attached to the two-dimensional array of redistribution structures; and the method comprises dicing the two-dimensional array of redistribution structures, whereby a plurality of fan-out semiconductor dies is formed.

8. The method of claim 7, further comprising forming a molding compound matrix around the two-dimensional array of semiconductor die sets, wherein each of the plurality of fan-out semiconductor dies comprises a molding compound die frame that includes a respective diced portion of the molding compound matrix.

9. The method of claim 1, further comprising:

forming a substrate-side dielectric layer directly on the first redistribution interconnect structures; and forming via openings through the substrate-side dielectric layer, wherein the fan-out bump structures fill the via openings.

10. The method of claim 9, further comprising:

depositing a continuous barrier metal layer and a continuous copper seed layer over the first planar surfaces of the first redistribution interconnect structures;

forming a patterned electroplating mask layer over the continuous copper seed layer;

electroplating copper on physically exposed surfaces of the continuous copper seed layer within openings through the patterned electroplating mask layer; and removing the patterned electroplating mask layer and portions of the continuous copper seed layer and the continuous barrier metal layer that are not covered by electroplated portions of copper.

11. The method of claim 1, wherein each of the fan-out bump structures comprises a respective copper portion that formed directly on the first planar surface of a respective one of the first redistribution interconnect structures.

12. The method of claim 11, further comprising:

depositing a continuous copper seed layer directly on the first planar surfaces of the first redistribution interconnect structures;

forming a patterned electroplating mask layer over the continuous copper seed layer;

electroplating copper on physically exposed surfaces of the continuous copper seed layer within openings through the patterned electroplating mask layer; and removing the patterned electroplating mask layer and portions of the continuous copper seed layer that are not covered by electroplated portions of copper.

13. A method of forming a semiconductor structure, comprising:

forming first redistribution interconnect structures of an interposer on a top surface of a first adhesive layer over a first carrier wafer, wherein each of the first redistri-bution interconnect structures has a respective first planar surface located entirely within a first horizontal plane;

forming redistribution dielectric layers and additional redistribution interconnect structures over the first redistribution interconnect structures, whereby at least one redistribution structure including a respective sub-set of the first redistribution interconnect structures, a respective portion of the redistribution dielectric layers, and a respective subset of the additional redistribution interconnect structures is formed;

attaching a respective set of one or more semiconductor dies to each of the at least one redistribution structure while the first adhesive layer and the first carrier wafer are attached to a backside of the at least one redistri-bution structure;

physically exposing the first planar surfaces of the first redistribution interconnect structures by removing the first carrier wafer and the first adhesive layer after the respective set of one or more semiconductor dies is attached to each of the at least one redistribution structure; and forming fan-out bump structures on the physically exposed first planar surfaces of the first redistribution interconnect structures.

14. The method of claim 13, wherein all of the physically exposed first planar surfaces of the first redistribution interconnect structures are located entirely within the first horizontal plane.

15. The method of claim 13, further comprising:

depositing a first continuous barrier metal layer and a first continuous copper seed layer over the top surface of the first adhesive layer;

forming a first patterned electroplating mask layer over the first continuous copper seed layer; electroplating copper on physically exposed surfaces of the first continuous copper seed layer within openings through the first patterned electroplating mask layer; and removing the first patterned electroplating mask layer and portions of the first continuous copper seed layer and the first continuous barrier metal layer that are not covered by electroplated portions of copper.

16. The method of claim 13, wherein:

each of the first redistribution interconnect structures comprises a vertical stack of a respective first barrier metal layer and a first copper plate portion; and planar surfaces of the first barrier metal layer are formed directly on the top surface of the first adhesive layer within the first horizontal plane.

17. A method of forming a semiconductor structure, comprising:

forming first redistribution interconnect structures of an interposer on a top surface of a first adhesive layer over a first carrier wafer, wherein each of the first redistri-bution interconnect structures has a respective first planar surface located entirely within a first horizontal plane;

forming redistribution dielectric layers and additional redistribution interconnect structures over the first redistribution interconnect structures, whereby at least one redistribution structure including a respective sub-set of the first redistribution interconnect structures, a respective portion of the redistribution dielectric layers, and a respective subset of the additional redistribution interconnect structures is formed;

attaching a respective set of one or more semiconductor dies to each of the at least one redistribution structure while the first adhesive layer and the first carrier wafer are attached to a backside of the at least one redistribution structure;

removing the first carrier wafer and the first adhesive layer after the respective set of one or more semiconductor dies is attached to each of the at least one redistribution structure; and forming fan-out bump structures on the physically exposed first planar surfaces of the first redistribution interconnect structures.

18. The method of claim 13, further comprising forming on-interposer bump structures on topmost redistribution interconnect structures to the additional redistribution interconnect structures, wherein each set of the one or more semiconductor dies is attached to a respective subset of the on-interposer bump structures.

19. The method of claim 13, wherein:

the at least one redistribution structure comprises a two-dimensional array of redistribution structures; a two-dimensional array of sets one or more semiconductor dies is attached to the two-dimensional array of redistribution structures; and the method comprises dicing the two-dimensional array of redistribution structures, whereby a plurality of fan-out semiconductor dies is formed.

20. The method of claim 13, further comprising:

forming a substrate-side dielectric layer directly on the first redistribution interconnect structures; and forming via openings through the substrate-side dielectric layer, wherein the fan-out bump structures fill the via openings.

* * * * *